United States Patent [19]

Waldhauer

[11] Patent Number: 4,882,762

[45] Date of Patent: Nov. 21, 1989

[54] MULTI-BAND PROGRAMMABLE COMPRESSION SYSTEM

[75] Inventor: Fred D. Waldhauer, La Honda, Calif.

[73] Assignee: Resound Corporation, Redwood City, Calif.

[21] Appl. No.: 160,023

[22] Filed: Feb. 23, 1988

[51] Int. Cl.⁴ .................... H04R 29/00; H04B 1/64
[52] U.S. Cl. ................................. 381/106; 455/72
[58] Field of Search ............... 381/104, 106, 94, 98, 381/29, 23.1; 455/72

[56] References Cited

U.S. PATENT DOCUMENTS

| | | | |
|---|---|---|---|
| 3,784,750 | 1/1974 | Stearns | 381/106 |
| 4,068,092 | 1/1978 | Ikoma | 381/104 |
| 4,253,072 | 2/1981 | Fisher | 381/94 |
| 4,696,044 | 9/1987 | Waller | 381/106 |

FOREIGN PATENT DOCUMENTS 2111356 6/1983 United Kingdom ................ 381/106

OTHER PUBLICATIONS

Signal Processing to Improve Speech Intelligibility in Perceptive Deafness, by Edgar Villchur, The Journal of the Acoustical Society of America, pp. 1646–1657, vol. 53, No. 6, 1973.

Widlar R. T., "A New Breed of Linear IC's Runs at 1 Volt Levels", Electronics, Mar. 29, 1979, p. 115.
Dillon H., and Walker G., "Compression in Hearing Aids", An Analysis, A Review and Some Recommendations, National Acoustic Laboratories, Commonwealth Dept. of Health Rpt., No. 90, Jun. 1982.

Primary Examiner—Tommy P. Chin

[57] ABSTRACT

A programmable low voltage multi-band compression system suitable for use with hearing aids is described. Received audio signals are processed by a band split filter which separates the received audio signal into a plurality of frequency bands. A plurality of compressors coupled to the band split filter compresses each of the respective frequency bands. The output of the compressor are then summed to generate a composite audio signal. The compression ratio of each of the compressors is set, in response to a set of control signals, to a preselected independent value. The average gain of each of the compressors is set to a preselected level independently of the other compressors. In addition, the compression ratio of each compressor may vary with input signal level. Another set of control signals is employed for setting the gain of the compressor to provide a volume control function.

14 Claims, 26 Drawing Sheets

MULTI-BAND PROGRAMMABLE COMPRESSION SYSTEM

FIELD OF THE INVENTION

This invention relates to the field of audio signal processing and specifically to a programmable low voltage multi-band compression system suitable for use with hearing aids.

BACKGROUND OF THE INVENTION

Audio compressors and expanders are well known devices which are used to modify the dynamic range of an audio signal. An audio compressor or expander may be considered as having two parts: an electronically controlled variolosser or gain adjusting device and a control system with associated circuits which generate control signals which control the gain of the device as a prescribed function of the input (or output) signal.

Control of the dynamic range of an audio signal is important in several applications. Many times the dynamic range of a desired signal may exceed the processing capabilities of available audio circuitry. In many telephone systems, the audio signals are multiplexed, resulting in a poor signal-to-noise ratio. Therefore, it is desirable to compress the dynamic range of the audio signals prior to multiplexing and expanding the audio signals at the receiving end to allow a wider dynamic range signal to be passed through the telephone channel.

Another application for audio compressors are devices for the hearing impaired. In many cases, the response of the ear of a hearing impaired person will be substantially different, in terms of sensitivity and frequency response, than that of a normal person. Studies have shown that hearing aids with audio compression provide improved syllabic comprehension for persons with sensori-neural hearing losses. The use of audio compressors for the hearing impaired is described extensively in a report written by Walker and Dillon, entitled "Compression In Hearing Aids: An Analysis, A Review And Some Recommendations," NAL Report No. 90, published by the Australian Commonwealth Department of Health, National Acoustics Laboratories, June 1982.

Audio compressors may also be advantageously employed to tailor the characteristics of a hearing aid device to compensate for the deficiencies of individual users or to simulate normal hearing under a variety of situations such as very quiet or very noisy environments. For example, in many cases, a hearing impaired person will only experience a hearing loss at high frequencies and at high audio levels. Therefore, it may be desirable to alter the gain of the compressor as a function of the frequency and audio level of the audio signal. For example, in extremely noisy environments, it may be desirable to lower the high frequency gain of the compressor and in quiet environments, it may be desirable to increase the high frequency gain of the compressor. Audio compressors are readily adapted for both of these functions. These concepts may be further understood by referring to Villchur, E., "Signal processing to improve speech intelligibility in perceptive deafness," *Journal of Acoustical Society of America*, Vol. 53, pp.1646-1657.

For many types of hearing impairment, the degree of hearing loss is audio level and frequency dependent. In other words, the degree of relative hearing loss at high frequencies will vary with the audio sound level. Thus, the amount of correction that must be applied should also be varied with audio signal level. Usually, more high frequency correction is applied at low signal levels. Since each hearing impaired person has a unique hearing response, a compression system with adjustable compression ratio and frequency response is highly desirable.

Audio compressors are characterized in two categories. If the control signals are derived from the input signal of the compressor, the compressor is said to be of the feedforward type; if the control signals are derived from the output of the compressor, the compressor is said to be of the feedback type. The feedforward configuration requires that the dynamic range of the gain control circuitry be equal to that of the input signal. The advantage of this configuration is that the circuit is inherently stable. In a feedback configuration, a larger range of signals can be accurately processed since the gain control signal samples the output signal which has already been compressed. However, instability is often a problem with feedback compressors.

Many variations in the topology of compressors have appeared in the past. One example of a variable gain circuit for use with compressors or expanders is the Signetics NE570 which is primarily adapted for use with telephone systems. Another example of a prior compressor is disclosed in U.S. Pat. No. 4, 112,254, invented by Blackmer and entitled "Signal Compander System".

While the advantages of compression have been recognized, each of the above-mentioned systems has used compressors having a relatively fixed compression ratio or has been limited to uses where a relatively high voltage is available to power the compressor. The trend in the hearing aid industry today is to design hearing aid devices in increasingly small packages and some models today are tiny enough to be implanted in the ear canal. The advantages of compression have heretofore been unavailable in a canal aid device because these devices are typically operated from a single cell battery which provides a relatively low power supply voltage with limited current output. Prior to the present invention, a programmable compressor system having a continuously variable compression ratio, a programmable frequency response, and which is capable of operating from a 1.2 V battery has proved impossible to manufacture.

SUMMARY OF THE INVENTION

Briefly described, the present invention contemplates a multi-band compression system which includes a means for receiving an audio signal. The received audio signal is processed by a band-split filter which separates the received audio signal into a plurality of frequency bands. A plurality of compressors coupled to the band-split filter compresses each of the respective frequency bands. The outputs of the compressors are then summed to generate a composite audio signal. The present invention contemplates the use of a means, responsive to a set of control signals for setting the compression ratio of each of the compressors to a preselected independent value and for setting the average gain of each of the compressors to a preselected level independently of the other compressor. In addition, the present invention contemplates the use of compressors wherein the compression ratio of the compressor may vary with input signal level. In another aspect of the present invention, another set of control signals are employed for setting the gain of the compressor to provide a volume control function.

Accordingly, it is an object of the present invention to provide a multi-band programmable audio compression system which is operable from a low voltage battery.

It is another object of the present invention to provide a multi-band programmable audio compression system which may be used to expand or compress an audio signal.

It is yet another object of the present invention to provide a multi-band programmable audio compression system with a continuously variable compression ratio which is easily manufactured on an integrated circuit.

It is still another object of the present invention to provide a multi-band programmable audio compression system with a continuously variable compression ratio and variable gain.

It is still another object of the present invention to provide a multi-band programmable audio compression system wherein the maximum signal handling capability is provided for the largest input signals.

It is still another object of the present invention to provide a multi-band programmable audio compression system wherein gain and compression ratio in each respective frequency band may be adjusted independently.

It is still another object of the present invention to provide a multi-band programmable audio compression system wherein the frequency response of the audio compressor system may vary with audio input signal level.

BRIEF DESCRIPTION OF THE DRAWING

These and other objects may be fully understood through the description below and the accompanying drawing in which.

DETAILED DESCRIPTION OF THE INVENTION

Figure 1A:
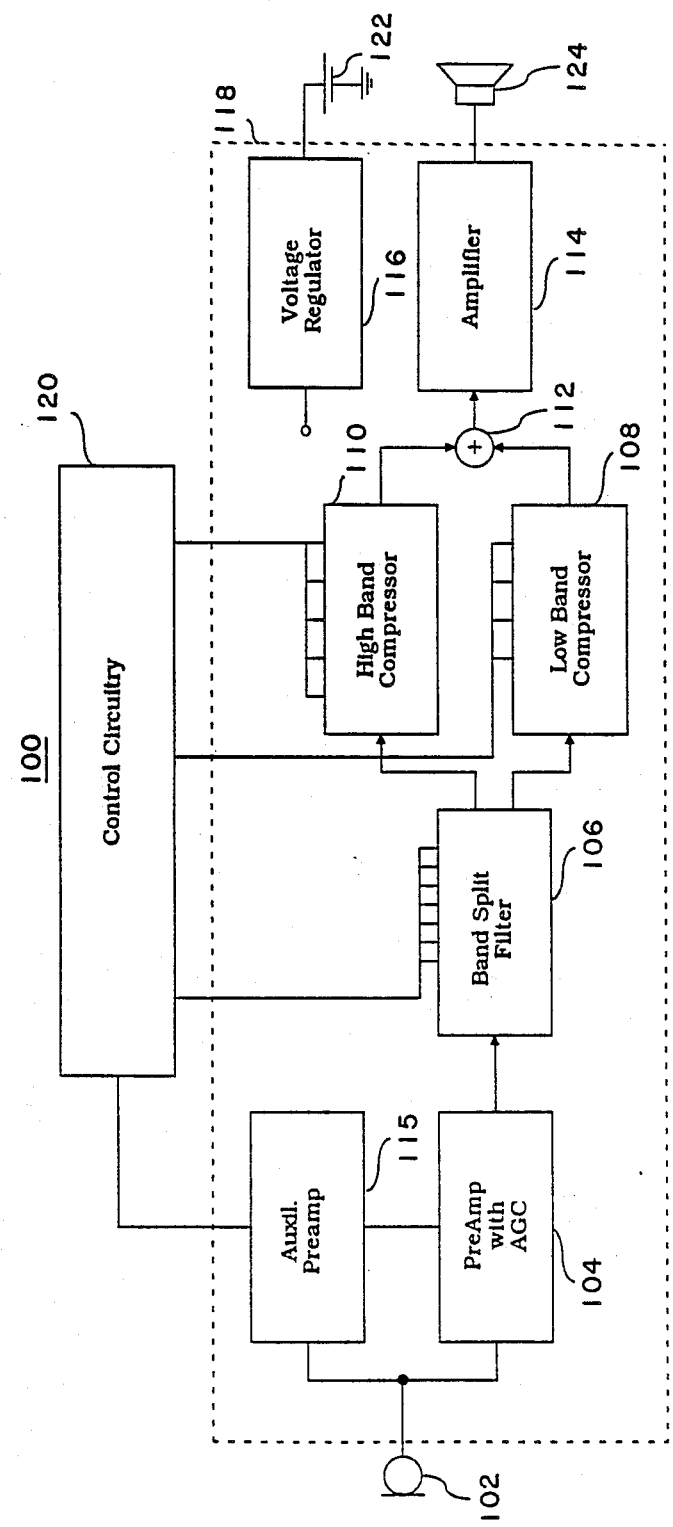
FIG. 1A is a block diagram of the programmable multi-band compression system of the present invention.

A compressor or expander comprises a variable gain circuit or variolosser and a control circuit which varies the gain of the variolosser based on a desired relationship between the input and output signals. In the case of the present invention, the variable gain circuit or variolosser is a current multiplier whose transfer function is linear. The control circuits of the present invention are adapted to programmably control a plurality of variolossers to provide variable gain and compression ratio to provide a desired gain, compression ratio and frequency response which may be adaptively modified for the needs of individual users.

Referring now to FIG. 1, the programmable multi-band compressor system 100 receives an audio signal with microphone 102. The output of microphone 102 is coupled to a preamplifier and automatic gain control circuit (AGC) 104 and an auxiliary preamplifier 115. The output of the preamplifier and automatic gain control circuit 104 is coupled to programmable bandsplit filter 106 which separates the audio signal into high and low frequency bands. The low frequency band output of programmable bandsplit filter 106 is coupled to programmable compressor 108 and the high frequency band output of programmable bandsplit filter 106 is coupled to programmable compressor 110. The output signals of the low band compressor 108 and high band compressor 110 are coupled to respective inputs of summing circuit 112 which combines these output signals to produce a composite audio signal. The output of summing circuit 112 is coupled to amplifier 114 which amplifies the composite audio signal to a level sufficient to drive an annunciator 124 which is coupled to the output of amplifier 114. The system 100 further includes voltage regulator 116 for supplying a regulated voltage to various circuits of the system 100. As will be appreciated from the discussion below, the present programmable multi-band compressor system 100 is particularly adapted for implementation on an integrated circuit and all of the circuits enclosed in the area 118 may be constructed on a single integrated circuit substrate. The present programmable multi-band compressor system 100 may be powered by a single cell, low voltage battery 122.

The programmable multi-band compressor system 100 is adapted to receive a plurality of control signals which may be generated by an external control circuit 120. The control circuit 120 is coupled to bandsplit filter 106 and to the low and high band compressors 108 and 110, respectively. The control signals generated by control circuit 120 are adapted to control the frequency split between the low and high frequency band as well as the gain and compression ratio of the low and high band compressors 108, 110 to generate a desired response for the system 100 to compensate for virtually any type of hearing impairment.

Figure 1B:
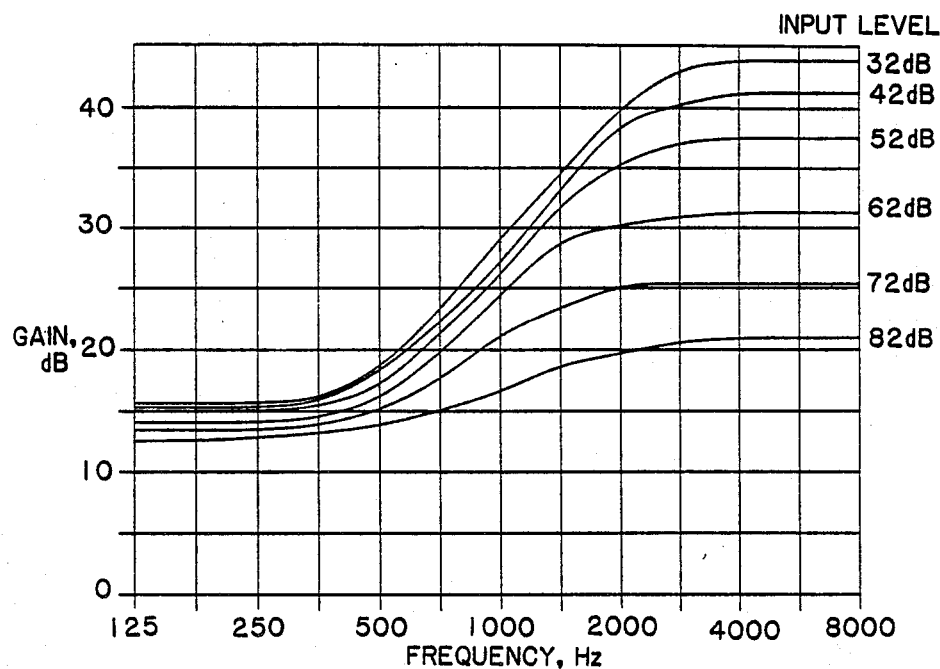
FIGS. 1B-1G are a series of graphs detailing gain and frequency response characteristics for several alternate programmed settings of the present invention.
Figure 1C:
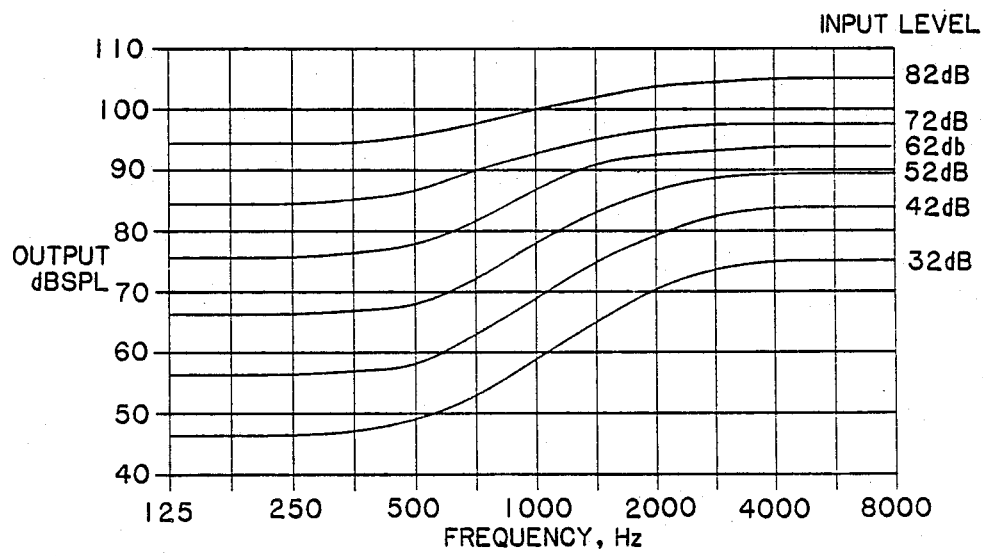

Referring now to FIGS. 1B through 1G, there are a series of diagrams detailing the gain and frequency response of the present multi-band compression system when programmed to compensate for a variety of types of hearing deficiencies. The graphs shown in FIGS. 1B and 1C show one typical composite gain and frequency response wherein the asymptotic or maximum compression ratio for the low band compressor 108 is set at approximately 1.1 and the asymptotic compression ratio for the high band compressor 110 is set at approximately 3. In the graphs shown in FIGS. 1B and 1C, the bandsplit frequency for the bandsplit filter 106 is set at approximately 1000 Hz. These settings for the high and low band compressors are useful for a person having a hearing loss at high frequencies, particularly at low audio levels. Therefore, at low audio levels, the present invention provides a large amount of high frequency gain and at low audio levels, the high frequency gain is reduced as shown in FIG. 1B. In other words, at low audio levels, the high frequency gain of the present invention is approximately 40 dB, while at high audio levels, the high frequency gain of the present invention is approximately 22 dB. The composite output of the present invention when programmed as described above is shown in FIG. 1C.

Figure 1D:
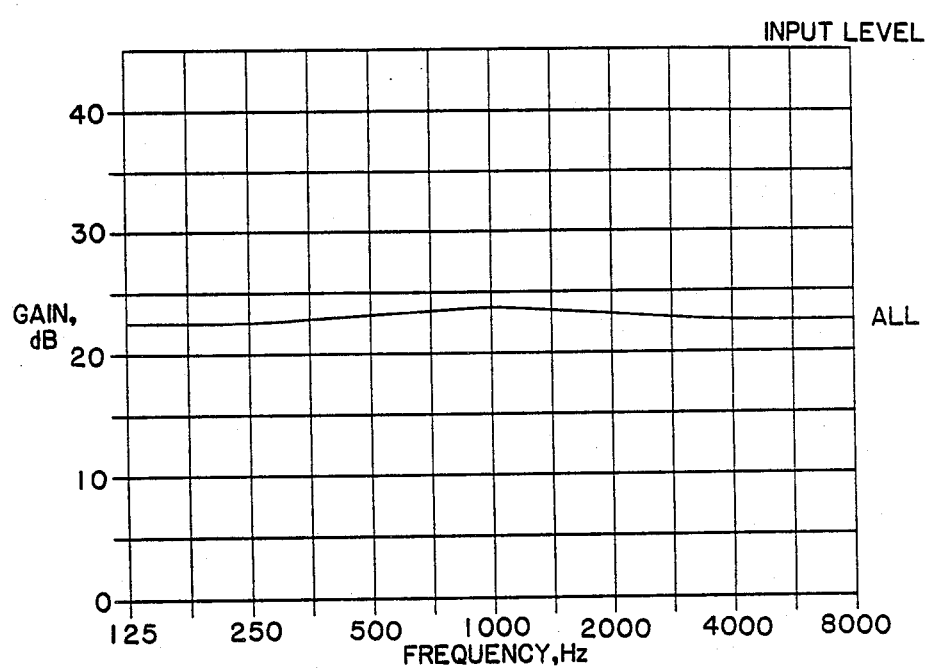
Figure 1E:
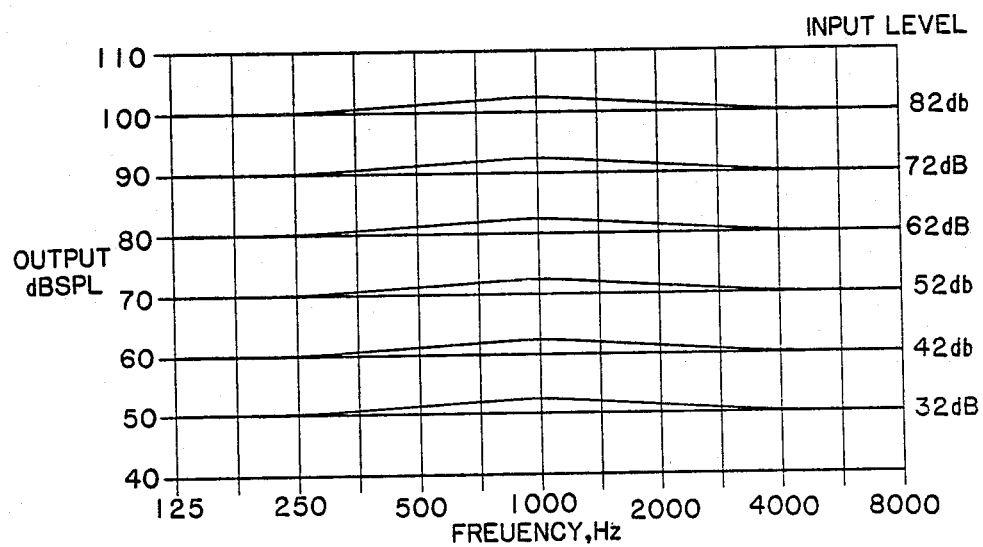

Referring now to FIG. 1D, the gain versus frequency response of the present invention is shown for the condition wherein the high and low band compressors are set to a compression ratio of approximately unity. In this mode, all frequencies are processed with approximately the same gain with a slight increase in gain appearing at the crossover frequency of the bandpass filter 106. This configuration of the present invention is useful for persons with non-frequency dependent hearing loss. The output of the present invention in this configuration is shown in FIG. 1E.

Figure 1F:
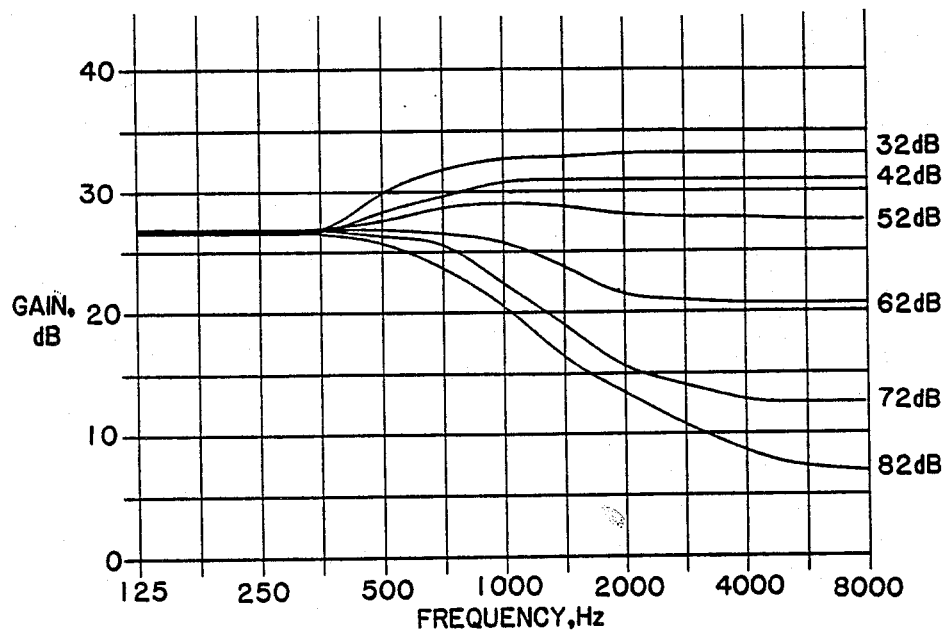
Figure 1G:
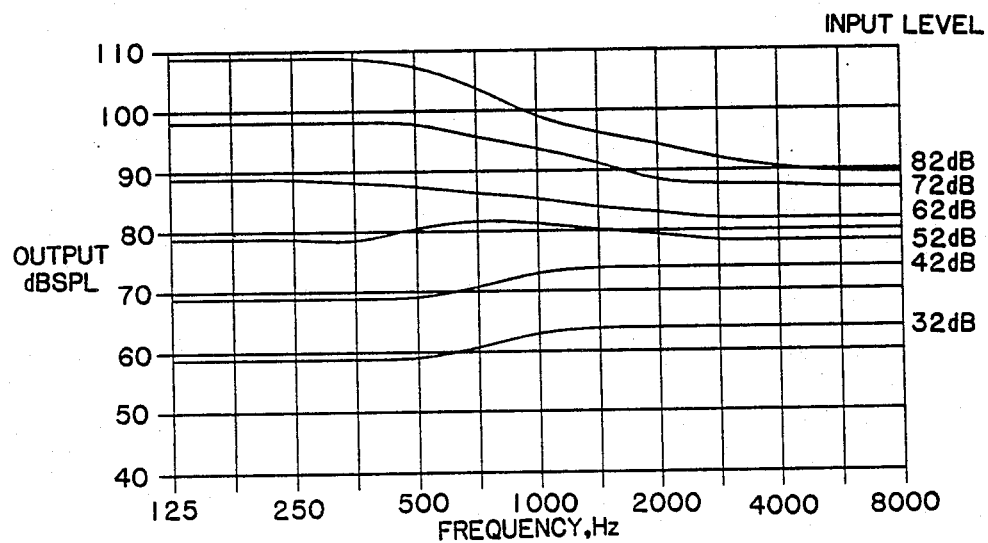

Referring now to FIG. 1F, there is a graph of another possible gain and frequency response characteristic which may be generated by the present invention. In this condition, the low band compressor 108 is programmed with a compression ratio of approximately 1.01 and the high band compressor 110 is adjusted with a compression ratio of approximately 4. The crossover frequency for the band split filter is set at approximately 1000 Hz. These settings are useful to compensate for a type of hearing loss wherein the hearing response of the hearing impaired person is more sensitive at high frequencies as audio signal level increases. To compensate for this type of hearing loss, the present invention reduces the high frequency gain as audio level rises. The high frequency gain of the present invention is increased to a lesser extent at lower signal levels. The output level versus frequency of the present invention in this configuration is shown in FIG. 1G.

While the graphs shown in conjunction with FIGS. 1B-1G detail the performance of the present invention in the context of several preprogrammed settings, the presentation contemplates the use of a programming means which may be used to program the gain and compression ratio of each individual compressor means, the composite of gain and compression ratio of the compressors collectively, the frequency split between the respective compressors and the use of compressors wherein the gain of the compressor may vary as a function of frequency response. The versatility afforded by programmable compressors and bandsplit filter allow the present system to correct virtually any type of hearing deficiency.

Figure 2:
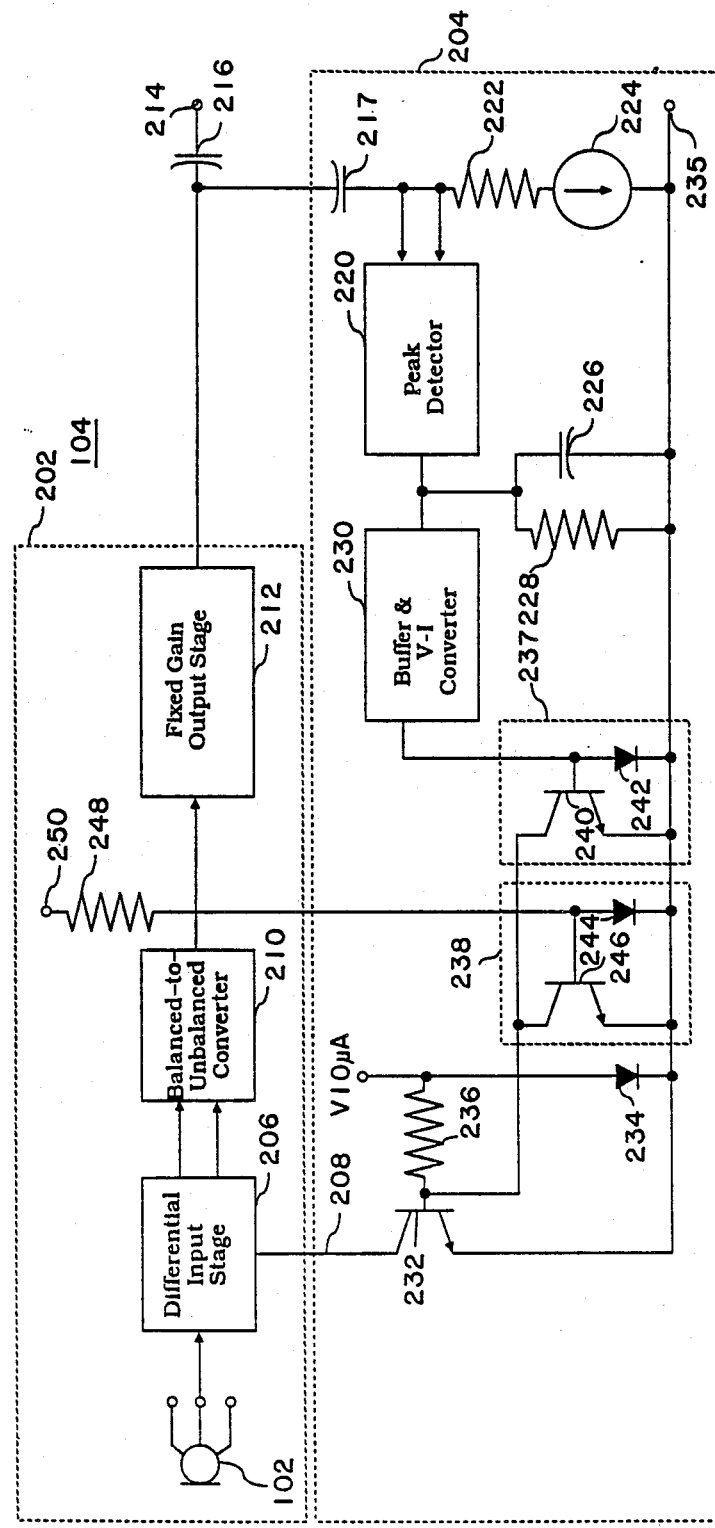
FIG. 2 is a block diagram of the preamplifier and automatic gain control circuits of the present invention.

Referring now to FIG. 2, the preamplifier and AGC circuit 104 is shown in block diagram form. The preamplifier portion 202 of circuit 104 amplifies the output of microphone 102 to a level which is required by bandsplit filter 106 to provide an output signal with a desired gain and signal-to-noise ratio. The AGC portion 204 of the circuit 104 is used to monitor the signal level output by preamplifier 202 and maintain this output level within predefined limits. The preamplifier 202 includes differential input stage 206 which is coupled to microphone 102. The gain of differential input stage 206 is controlled by control line 208 which is coupled to AGC circuit 204. The output of differential input stage 206 is coupled to balanced-to-unbalanced converter 210 which converts the differential output of differential input stage 206 to an unbalanced audio signal processed by the fixed gain output stage 212 which is coupled to the output of balanced-to-unbalanced converter 210. The output of the fixed gain output stage 212 is coupled to output terminal 214 through capacitor 216. The output of fixed gain output stage 212 is further coupled to AGC circuit 204 through capacitor 217.

The AGC circuit 204 includes peak detector 220 which is coupled to the output of preamplifier 202 through capacitor 217. The peak detector is used to generate a signal which is related to the peak positive envelope of the audio signal produced by the preamplifier 202. The input to the peak detector 220 is further coupled to current source 224 through resistor 222. The current source 224 and resistor 222 are used to establish a DC bias level for the input stage of peak detector 220.

The peak envelope signal generated by peak detector 220 is developed across capacitor 226 and resistor 228. As an increasing audio signal appears at the input of peak detector 220, a voltage is developed across capacitor 226. As the voltage at the input of peak detector 220 drops, capacitor 226 is discharged through resistor 228. Thus, the response time of peak detector 220 may be controlled by adjusting the values of capacitor 226 and resistor 228. In the preferred practice of the present invention, capacitor 226 and resistor 228 provide an AGC release time of approximately 180 ms. The output of peak detector 220 is coupled to a buffer and voltage-to-current converter 230 which converts the voltage output of peak detector 220 to a current signal used to control preamplifier 202. The gain of preamplifier 202 is controlled by transistor 232 which is disposed with its collector coupled to control line 208 and its emitter coupled to ground terminal 235. As the current in the control line 208 increases, the gain of preamplifier 202 increases. This current is controlled by the base voltage of transistor 232. Transistor 232 is coupled to diode 234 through resistor 236. The voltage appearing at terminal V10 μA establishes current through diode 234 which is mirrored in transistor 232. The base of transistor 232 is further coupled to current mirrors 237 and 238. Current mirror 237 comprises transistor 240 and diode 242. Transistor 240 is disposed with its emitter coupled to ground terminal 235 and its collector coupled to the base of transistor 232. The base of transistor 240 is coupled to the output of buffer and voltage-to-current converter 230 and to diode 242 which is disposed with one terminal coupled to ground terminal 235.

As an increasing voltage is produced at the output of peak detector 220 (corresponding to an increasing input audio signal), an increasing current is produced at the output of buffer and voltage-to-current converter 230. This current is mirrored by diode 242 into transistor 240 which is forced further into conduction. As transistor 240 is forced further into conduction, current is drawn away from the base of transistor 232, thus reducing the current in control line 208 and reducing the gain of preamplifier 202. Therefore, as the signal level at the output of preamplifier 202 increases, the gain of preamplifier 202 is decreased to produce a signal having a relatively fixed voltage at the output of preamplifier 202. The circuit 104 further includes means for external user volume control comprising current mirror 238 which is formed by transistor 246 and diode 244. Transistor 246 is disposed with its collector coupled to the base of transistor 232 and its emitter coupled to ground terminal 235. The base of transistor 246 is coupled to diode 244 and is further coupled to resistor 248. The other terminal of diode 244 is coupled to ground terminal 235. Resistor 248 is further coupled to terminal 250. As an increasing voltage appears at terminal 250, an increasing current is generated through resistor 248 which is mirrored by diode 244 into transistor 246. This causes transistor 246 to draw current away from the base of transistor 232, thus reducing the gain of preamplifier 202. Terminal 250 may be coupled to a user adjustable voltage source to provide a user volume control function. In the preferred practice of the present invention, preamplifier 202 is disposed with a gain of approximately 26 dB, wherein the user volume control current mirror may reduce this gain by approximately 40%, while additional volume control reduction may be provided by other circuits of the present invention.

Figure 3:
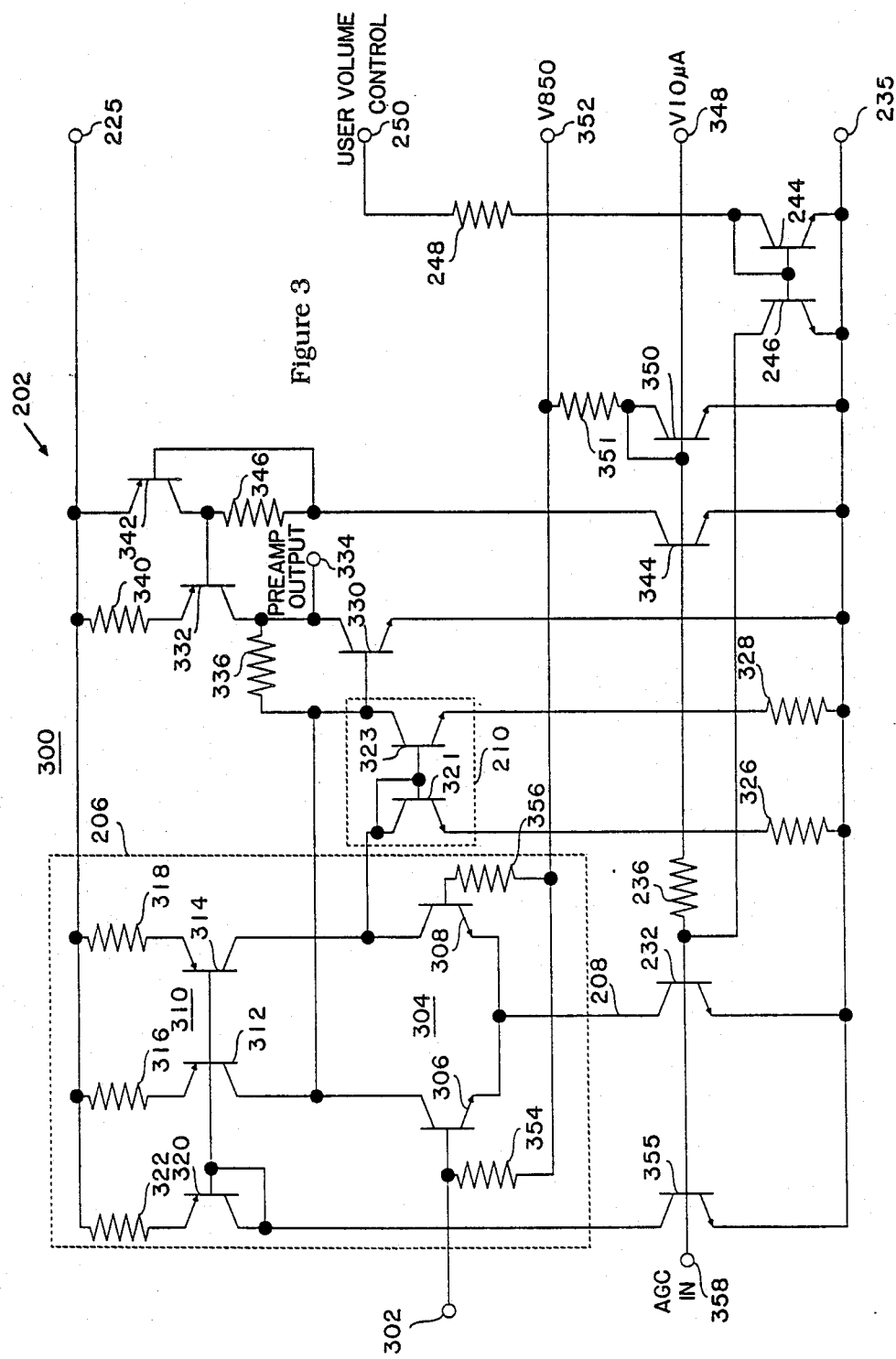
FIG. 3 is a schematic diagram of the preamplifier circuit of the present invention.

Referring now to FIG. 3, there is shown a schematic diagram of preamplifier 202 of FIG. 2. The circuit 300 is adapted to receive a low-level audio signal at terminal 302. The differential input stage 206 comprises an emitter coupled differential pair 304 which includes transistors 306 and 308. The base of transistor 306 is coupled to input terminal 302. The differential pair 304 is coupled to a current mirror load 310 formed by transistors 312 and 314 which are disposed with their bases coupled together and their emitters coupled to power supply terminal 225 through resistors 316 and 318, respectively. The collector of transistor 312 is coupled to the collector of transistor 306 and the collector of transistor 314 is coupled to the collector of transistor 308. The common base connection of transistors 312 and 314 is further coupled to the base and collector of transistor 320 which is disposed with its emitter coupled to the power supply terminal 225 through resistor 322. The common emitter connection of transistors 306, 308 is coupled to control line 208 which is further coupled to the collector of transistor 232. As noted above, the level of current flowing in control line 208 controls the gain of preamplifier 202.

The differential input stage 206 is coupled to balanced-to-unbalanced converter 210 which converts the differential output of differential stage 206 to a single-ended signal. Balanced-to-unbalanced converter 210 includes transistors 321 and 323 wherein transistor 321 is disposed with its base and collector coupled to the common collector connection of transistors 314 and 308 and its emitter coupled to ground terminal 235 through resistor 326. Transistor 323 is disposed with its base coupled to the base and collector connection of transistor 321 and its emitter coupled to ground terminal 235 through resistor 328. The fixed gain output stage 212 comprises transistor 330 which is disposed with its emitter coupled to ground terminal 235 and its base coupled to the collector of transistor 323. The collector of transistor 330 is further coupled to output terminal 334. A resistor 336 is coupled between the base and collector of transistor 330. Transistor 332 is disposed with emitter coupled to power supply terminal 225 through resistor 340 and its collector coupled to the collector of transistor 330. Transistor 342 is disposed with its emitter coupled to power supply terminal 225 and its collector coupled to the base of transistor 332. The collector of transistor 342 is also coupled to the collector of transistor 344 through resistor 346. The emitter of transistor 344 is coupled to ground terminal 235 and the base of transistor 344 is coupled to the V10 μA reference terminal 348. A transistor 350 is disposed with its emitter coupled to ground terminal 235 and its base and collector coupled to an 850 mV voltage reference terminal 352 through resistor 351. A bias transistor 355 is disposed with its emitter coupled to ground terminal 235, its base coupled to the base of transistor 232 and its collector coupled to the common base and collector connection of transistor 320.

The circuit 300 further includes user volume control means comprising transistor 246 and diode 244 which are disposed with their emitters coupled to ground terminal 235 and their bases coupled together. The base and collector of transistor 244 are coupled together and this common base and collector connection is coupled to control terminal 250 through resistor 248.

The input stage of circuit 300 further includes resistor 354 which is disposed between the base of transistor 306 and the 850 mV voltage source terminal 352. Resistor 356 is disposed between the base of transistor 308 and 850 mV voltage source terminal 352.

The circuit 300 configuration provides a low-noise preamplifier stage which is highly immune to power supply noise and fluctuations. This is accomplished, in part, by resistors 322, 316, 318, 340 and 346 and transistors 320, 312, 314 and 332, which act as isolating current sources which decouple the circuitry 300 from direct power supply fluctuations so that the critical stages of the preamplifier are referenced to ground rather than the power supply input. Most integrated circuit amplifiers include emitter coupled pairs with PNP current mirrors that provide active loads and balanced to single-ended conversion. The present invention uses NPN transistors 321 and 323 with the emitter coupled pair 304 and wherein both of these transistors are fed current from the current mirror 310. In addition, the output stage formed by transistor 330 is an NPN transistor. By using NPN transistors for amplification, these transistors have electrodes coupled to ground rather than a potentially noisy power source. As will be discussed in more detail below, transistor 342 and resistor 346 form a zero-sensitivity isolating current source with a high degree of power supply rejection.

In operation, assuming the AGC and user volume control signals are zero, in its quiescent state, differential pair 304 is biased equally on both sides by resistors 354 and 356. Transistors 312 and 314 form a current mirror with respect to transistor 320. Transistor 320 is referenced to transistor 355 which sinks approximately 10 μA in the absence of the AGC and volume control signal. This current is mirrored in transistors 312 and 314. As an increasing input current appears at terminal 302, the base/emitter voltage of transistor 306 rises relative to the base/emitter voltage of transistor 308. This causes current to be drawn away from the base of transistor 330, thereby causing an increasing current to be delivered to output terminal 334. The balanced output of differential pair 304 is converted to a single-ended signal by the current mirror follower formed by transistors 321 and 323. With the current mirror load, differential pair 304 has a transconductance of approximately:

$$IEE/2VT$$

where: IEE is the current supplied by transistor 233 and $VT=kt/q$ or the thermal voltage of a transistor which is 26 mV at room temperature.

The output of the differential pair with its current mirror output is coupled to a common emitter feedback stage formed by transistors 330, 332 and 342 which has a transresistance of approximately RF. The voltage gain for the preamplifier is therefore defined as:

$$G_v = IEE_{RF}/2VT$$

Thus, where: IEE=30 μA, RF=82 KΩ; the gain of the preamplifier 202 is approximately 47 or 33 dB.

As noted above, resistors 354 and 356 are coupled between the respective inputs of differential pair 304 and an 850 mV voltage source (V850), which is the equivalent of an analog ground with an 850 mV offset. These resistors provide a slight attenuation of the input signal to avoid noise and DC offset with respect to AGC circuit 204. As noted above, the gain of the preamplifier is controlled by the current flowing in control line 208. This current may be affected by AGC circuit 204 and the user volume control section of circuit 202. The output of AGC circuit 204 is coupled to terminal 358. As an increasing signal appears at terminal 358, the AGC output begins to draw current out of terminal 358, thus reducing the current in control line 208. The user volume control provides an identical function wherein an increasing voltage at terminal 250 reduces the gain of preamplifier 202.

Figure 4:
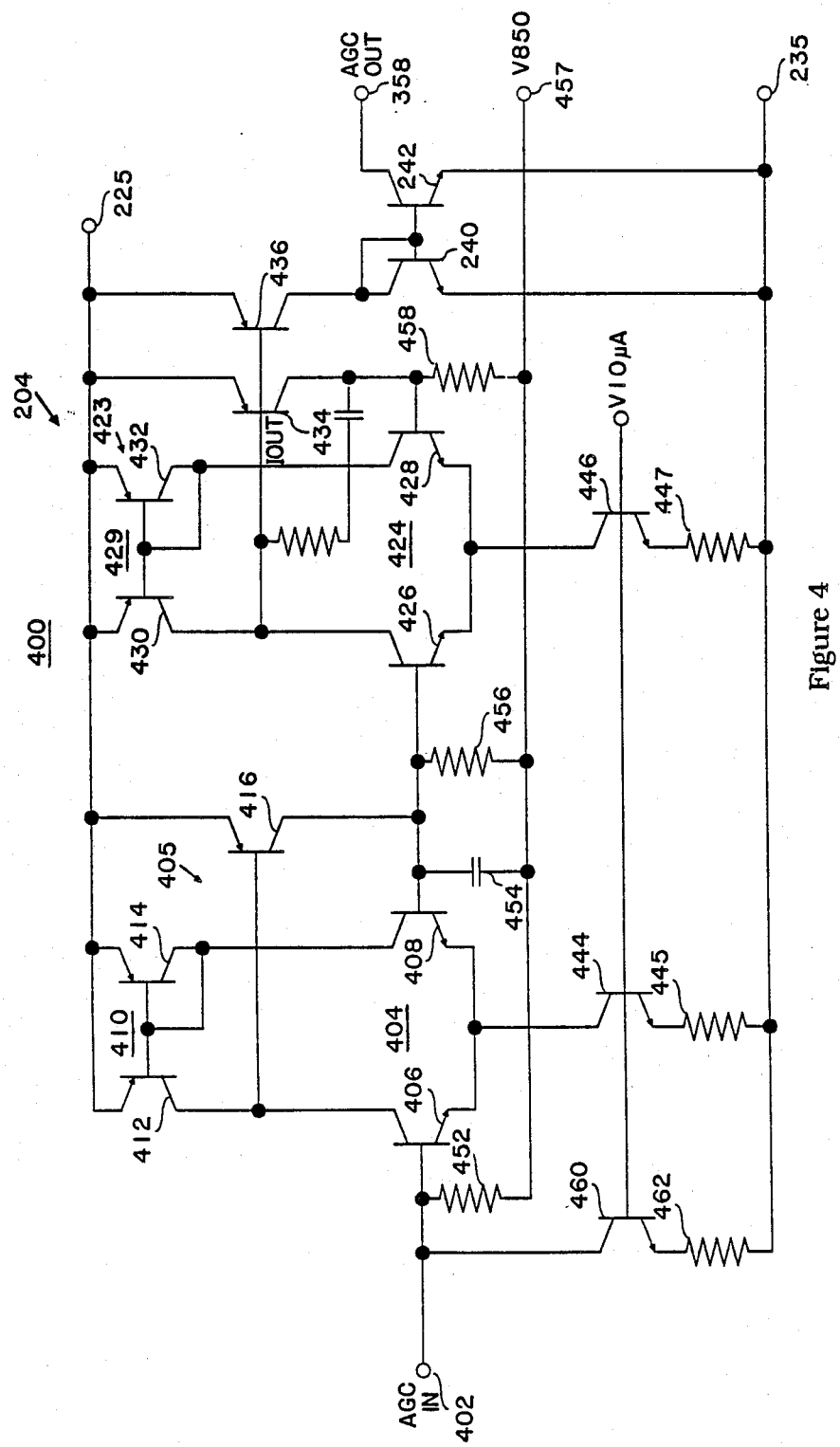
FIG. 4 is a schematic diagram of the automatic gain control circuit of the present invention.

Referring now to FIG. 4, the automatic gain control circuit 204 is shown in schematic form. The AGC 204 generates a voltage that follows the peak envelope of the audio input signal. The circuit 400 receives an audio input signal at terminal 402. The audio input signal is coupled to the non-inverting input of differential amplifier 405. The differential amplifier 405 includes differential pair 404 comprising transistors 406 and 408 coupled in a common emitter configuration. The base of transistor 406 comprises the non-inverting input of differential amplifier 405. The differential pair 404 is coupled to current mirror load 410 comprising transistors 412 and 414 which are disposed with their bases coupled in common and their emitters coupled to power supply terminal 225. Transistor 414 is coupled with its base and collector coupled together wherein any current flowing in transistor 414 is mirrored in transistor 412 based on the relative sizes of transistors 412 and 414. In other words, if transistor 414 and 412 are the same relative size, they will generate substantially the same currents. If transistor 412 is twice the size of transistor 414, transistor 412 will generate twice the current flowing in transistor 414. The diode connected transistor of a current mirror pair is hereinafter referred to as the current mirror reference transistor. The output stage of differential amplifier 405 comprises PNP transistor 416 which is disposed with its base coupled to the common collector connection of transistors 412 and 406 and its emitter coupled to power supply terminal 225.

The output stage of AGC 204 comprises buffer differential amplifier 423 which includes differential pair 424 formed by transistors 426 and 428 which are coupled in a common emitter configuration. The differential pair 424 is coupled to current mirror load 429 formed by transistors 430 and 432 which are disposed with their bases coupled together and their emitters coupled to power supply terminal 225. The base and collector of transistor 432 are coupled together, thereby forming the reference transistor of current mirror 429. The output stage of buffer differential amplifier 423 is formed by transistors 434 and 436 which are coupled with their bases coupled to the common collector connection of transistors 426 and 430 and their emitter coupled to power supply terminal 225. The collector of transistor 434 is further coupled to the base of transistor 428 to provide feedback for buffer differential amplifier 423. The collector of transistor 436 is coupled to the collector of transistor 240 which is disposed with its emitter coupled to ground terminal 235. Transistor 242 is disposed with its emitter coupled to ground terminal 235, its base coupled to the base of transistor 240 and its collector coupled to AGC output terminal 358.

The reference currents for differential amplifiers 405 and 423 are controlled by transistors 444 and 446, respectively, which are disposed with their collectors coupled to the respective common emitter connections of differential pairs 404 and 424, their bases coupled together and their emitters coupled to ground terminal 235 through resistors 445 and 447, respectively. The common base connection of transistors 444 and 446 is further coupled to current source reference terminal V10 μA which establishes a base/emitter voltage for transistors 444 and 446 corresponding to approximately a 10 μA current through the collectors of these transistors. Transistor 460 is disposed with its collector coupled to the base of transistor 406, its emitter coupled to ground through resistor 462 and its base coupled to current source reference terminal V10 μA.

The inverting input and output of differential amplifier 405 are coupled to the non-inverting input of differential amplifier 423. Bias and feedback for differential amplifier 405 is established by resistors 452 and 456 which are disposed between the respective bases of transistors 406 and 408 and an 850 mV voltage source coupled to terminal 457. Resistor 458 is disposed between the base of transistor 428 and the 850 mV voltage source terminal 457.

The operation of the AGC 204 is based on capacitor 454 and resistor 456 which are coupled in parallel between the bases of transistors 408 and 426 and bias voltage reference terminal 457. In operation, capacitor 454 functions as a storage capacitor which stores a voltage equal to the peak of the input signal, for a time constant set by resistor 456, modified somewhat by the bias voltage appearing at terminal 457. Capacitor 454 stores a voltage which is initially lower than than the positive voltage appearing at input terminal 402. When the voltage stored on capacitor 454 is lower than the input voltage appearing at terminal 402, the relatively higher voltage appearing at terminal 402 forces transistor 408 into conduction. This in turn forces transistor 416 further into conduction, thus charging capacitor 454 rapidly. When the voltage stored on capacitor 454 exceeds the voltage appearing at terminal 402, transistor 408 is forced out of conduction and its associated current mirror transistor is forced into saturation, thus turning off the output transistor 416. In this state, the leakage resistor 456 discharges capacitor 454 and compensates the voltage stored thereon to a voltage lower than the input voltage at terminal 402. The decay rate in this discharging mode is dependent primarily on the values of resistor 456 and capacitor 454. The buffer differential amplifier 423 reduces the discharge rate of capacitor 454 by providing a high impedance source between capacitor 454 and output terminal 358. The signal appearing at output terminal 358 therefore comprises a rectified current representation of the input voltage appearing at input terminal 402 corresponding to the peak envelope of the input signal.

Figure 5A:
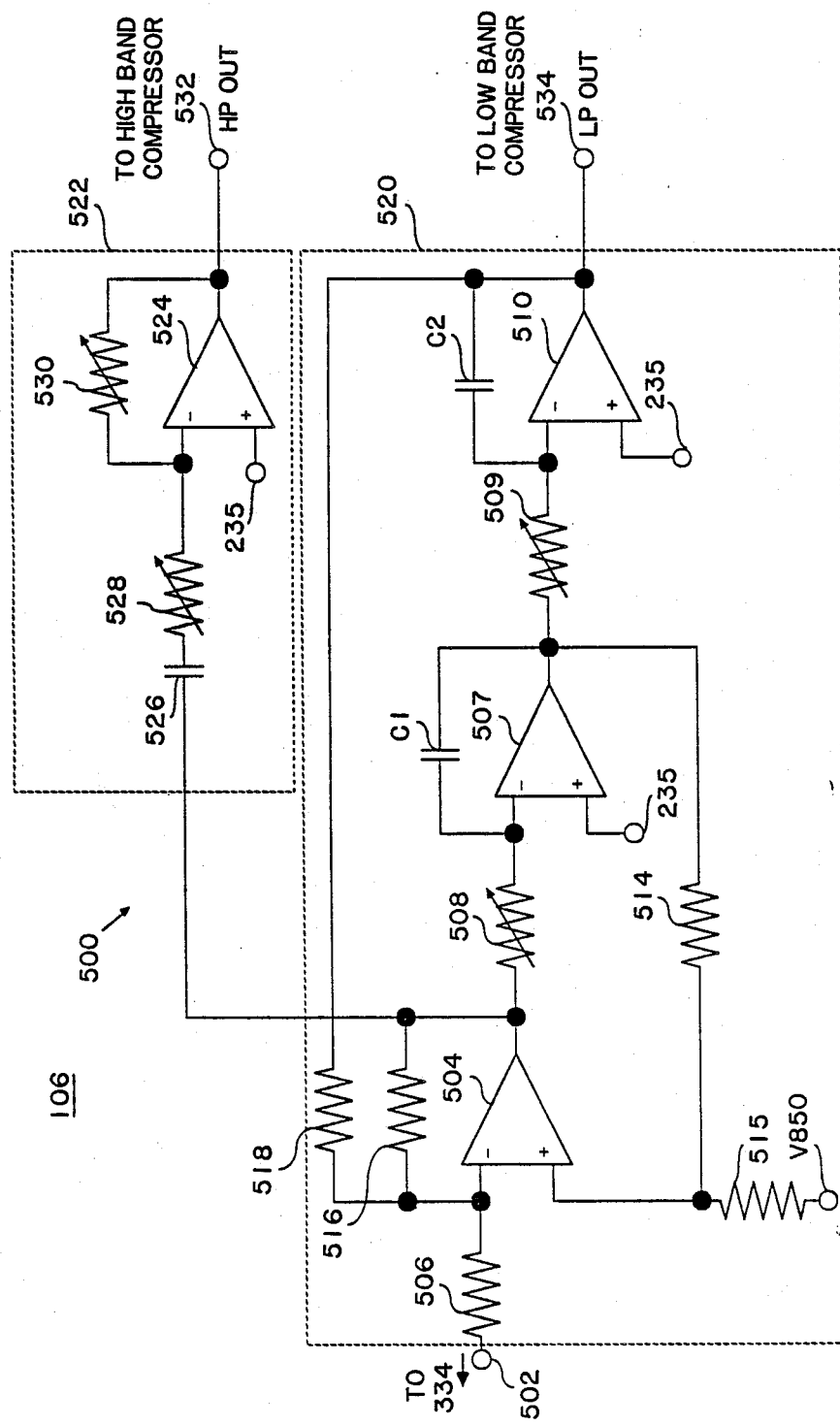
FIG. 5A is a block diagram of the bandpass filter section of the present invention.
Figure 5B:
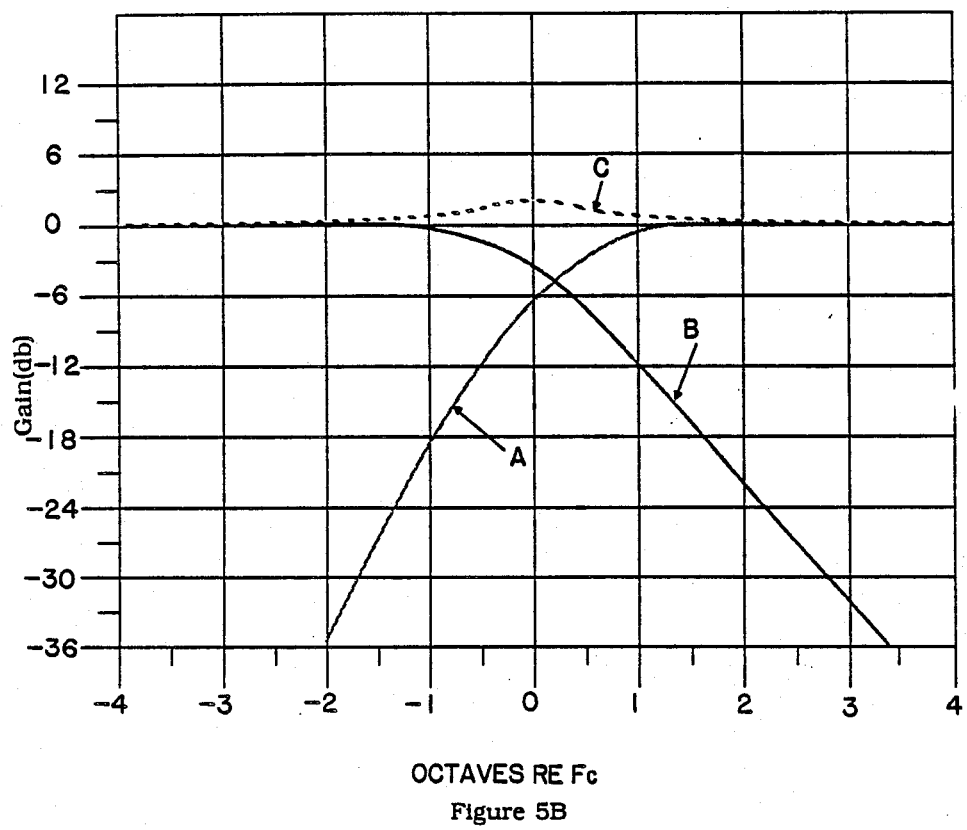
FIG. 5B is a graph showing the relationship between the high and low pass output signals of the circuit of FIG. 5A.

Referring now to FIG. 5A, the programmable bandsplit filter 106 divides the output of preamplifier 104 into high and low frequency bands. The bandsplit filter provides both high pass and low pass outputs from a single input. The circuit 500 is the detailed implementation of bandsplit filter 106. The circuit 500 is a well known circuit configuration of the state variable type which is adapted to receive an input signal at terminal 502. The inverting input of operational amplifier 504 is coupled to input terminal 502 through resistor 506. The non-inverting input of operational amplifier 504 is coupled to ground terminal 235 through resistor 515. The inverting input of operational amplifier 507 is coupled to the output of operational amplifier 504 through variable resistor 508. The non-inverting input of operational amplifier 507 is coupled to ground terminal 235. The inverting input of operational amplifier 510 is coupled to the output of operational amplifier 507 through variable resistor 509. The non-inverting input of operational amplifier 507 is coupled to ground terminal 235. A capacitor C1 is coupled between the inverting input and output of operational amplifier 507. A capacitor C2 is coupled between the inverting input and output of operational amplifier 510. A resistor 514 is coupled between the output of operational amplifier 507 and the non-inverting input of operational amplifier 504. A resistor 516 is coupled between the inverting input and output of operational amplifier 504. A resistor 518 is coupled between the inverting input of operational amplifier 504 and the output of operational amplifier 504.

Operational amplifiers 504, 507 and 510 form a butterworth type quadratic filter whose transfer function is defined by the state variable ratio of:

$$1/S^2 + S + 1$$

Quadratic filter 520 provides a cutoff of approximately 12 dB/octave wherein the breakpoint for the filter may be controlled by varying the resistance of resistors 508 and 509. The output of operational amplifier 510 is coupled to terminal 534 and this terminal comprises the low pass output of bandsplit filter 106.

The circuit 500 further includes high pass cutoff circuit 522 which converts the quadratic response of filter 520 to a high pass cubic response. The high pass cutoff circuit 522 includes operational amplifier 524 which is disposed with its inverting input coupled to the output of operational amplifier 504 through series coupled capacitor 526 and resistor 528. The non-inverting input of operational amplifier 524 is coupled to ground terminal 235. A resistor 530 is disposed between the inverting input and the output of operational amplifier 524. The output of operational amplifier 524 is further coupled to terminal 532 and this terminal comprises the high pass output of bandsplit filter 106. The transfer function for the high pass portion of bandsplit filter 106 is defined by the state variable ratio of:

$$S/S^2 + S + 1$$

The breakpoint of high pass cutoff section 522 may be programmably altered by varying the values of resistors 528 and 530.

One possible frequency response for filters 520 and 522 is shown in graph form wherein graph A depicts the response of filter 520 and graph B depicts the response of filter 522. The composite response for the two filter sections is shown in Graph C.

Figure 6A:
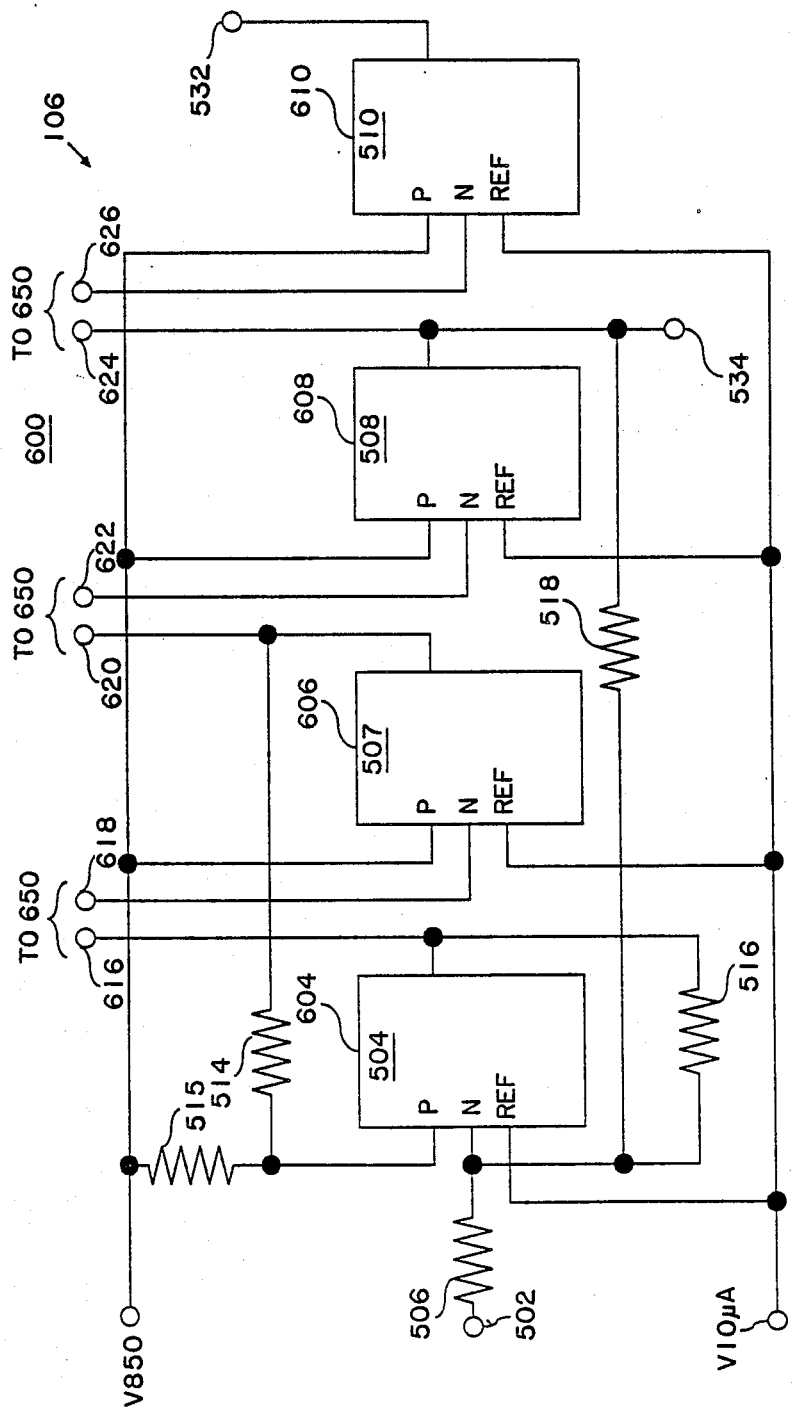
FIG. 6A is another block diagram of the bandpass filter section of the present invention which includes a means for programming the frequency response of the bandpass filter.

FIG. 6A is a schematic and block diagram of circuit 500 wherein circuit 600 is an implementation of circuit 500 adapted to receive a plurality of programmable inputs. The circuit includes a plurality of differential stages comprising differential stages 604, 606, 608 and 610 which correspond to operational amplifiers 504, 507, 508 and 510, respectively. The detailed circuit implementation of the differential stages 604, 606, 608 and 610 is shown in schematic form in FIGS. 7 through 10, respectively. Each differential stage is disposed with inverting and non-inverting inputs and an output. Each differential stage further includes a reference voltage input for biasing the differential stage. Differential stage 604 is disposed with its inverting input coupled to input terminal 502 through resistor 506 and its non-inverting input coupled to an 850 mV voltage reference terminal through resistor 515. Resistor 516 is coupled between the inverting input and output of differential stage 604. The output of differential stage 604 is further coupled to terminal 616. Differential stage 606 is disposed with its inverting input coupled to terminal 618 and its non-inverting input coupled to the 850 mV voltage reference terminal. Resistor 514 is coupled between the non-inverting input of differential stage 604 and the output of differential stage 606. The output of differential stage 606 is further coupled to terminal 620. Differential stage 608 is disposed with its inverting input coupled to terminal 622 its non-inverting input coupled to the 850 mV voltage reference terminal. Resistor 518 is coupled between the non-inverting input of differential stage 604 and the output of differential stage 608. The output of differential stage 608 is further coupled to terminal 624. Differential stage 610 is disposed with its inverting input coupled to terminal 626 and its non-inverting input coupled to the 850 mV voltage reference terminal. The output of differential stage 610 is further coupled to terminal 532. The respective current source reference inputs of differential stages 604, 606, 608 and 610 are coupled to current source reference terminal V10 μA. Terminals 616, 618, 620, 622, 624 and 626 are used to couple a programmable variable resistance across the respective differential stages to achieve a desired frequency split. For example, variable resistor 508 may suitably be coupled between terminals 616 and 618, variable resistor 509 would suitably be coupled between terminals 620 and 622, variable resistor 528 would suitably be coupled between terminals 624 and 626, and variable resistor 530 would suitably be coupled between terminals 626 and 532. These variable resistors may be disposed in a variety of implementations or, if a desired bandsplit is known, the variable resistors may be replaced with fixed resistors. If a programmable response is desirable, a variety of techniques for generating a programmable resistance is well known.

Figures 6B, 17:
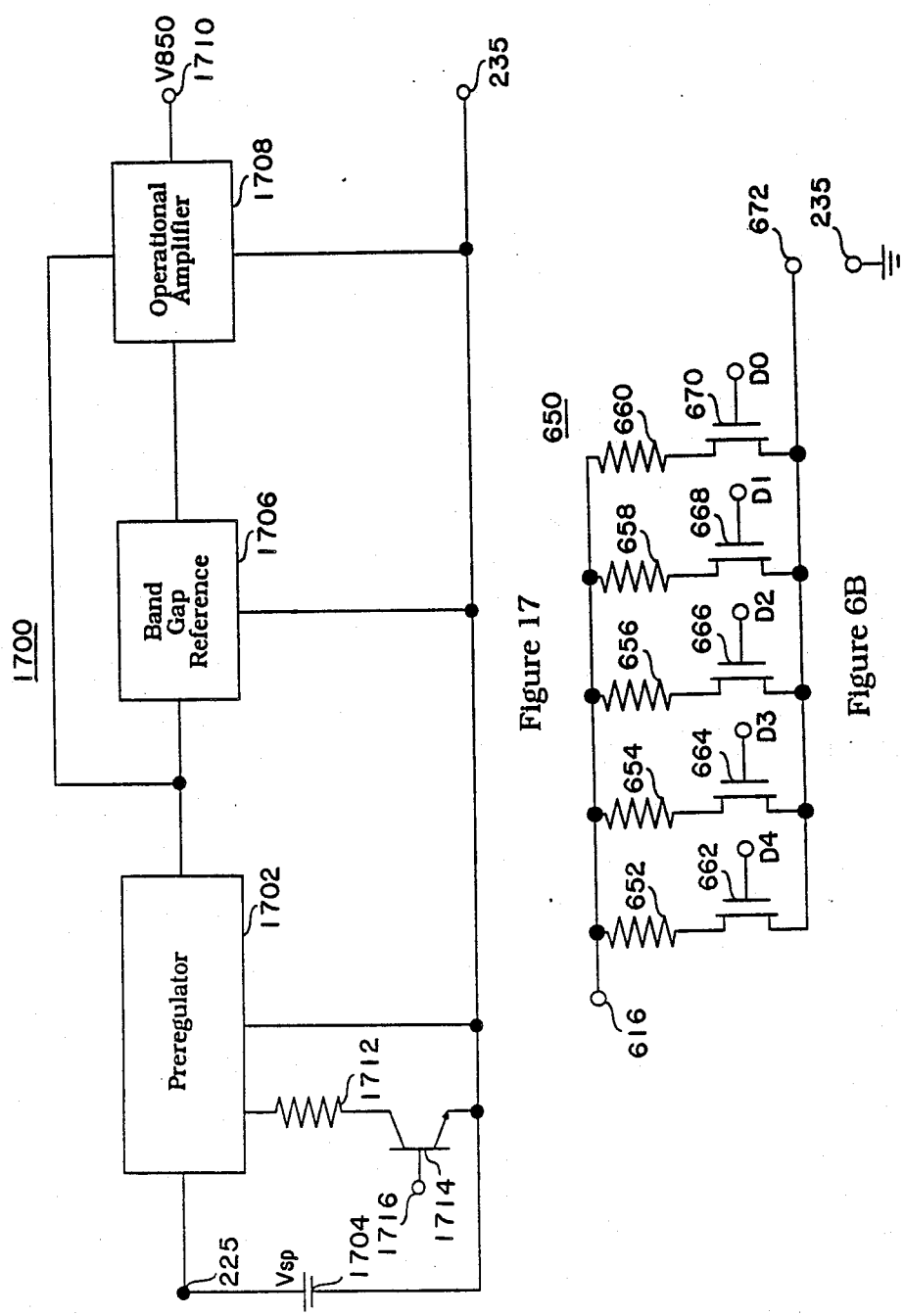
FIG. 6B is a schematic diagram of a circuit used for programming the circuit of FIG. 6A.
FIG. 17 is a block diagram of the voltage regulator circuit used to provide a reference voltage to the reference generator of FIG. 8.

One programmable resistor adapted for use with the present invention is shown in FIG. 6B. This programmable resistor may be disposed on a separate integrated circuit adapted to interface with a microprocessor or some other control circuit, or it may be manufactured in a form suitable for disposition on the same integrated circuit as circuit 600. The programmable 650 includes a plurality of parallel connected resistors 652–660 which may be selectively coupled together in a binary fashion with a plurality of switching transistors 662–670, respectively. Assuming the differential stages 604, 606, 608 and 610 are implemented as shown in FIGS. 7–10, and resistor 652 is 22.77 KΩ, resistor 654 is 90.60 KΩ, resistor 656 is 114 KΩ, resistor 658 is 181 KΩ, resistor 660 is 181 KΩ, and capacitor Cf is 2.2 nF, and identical programmable resistors 650 are disposed between the nodes 616, 618; 620, 622; 624, 626; and 626, 532, the programmable resistor 650 controls the band split of circuit 600 as follows:

| D4 | D3 | D2 | D1 | D0 | Freq. (Khz) |
|---|---|---|---|---|---|
| 0 | 0 | 0 | 0 | 1 | 0.40 |
| 0 | 0 | 0 | 1 | 0 | 0.50 |
| 0 | 0 | 0 | 1 | 1 | 0.90 |
| 0 | 0 | 1 | 0 | 0 | 0.63 |
| 0 | 0 | 1 | 0 | 1 | 1.03 |
| 0 | 0 | 1 | 1 | 0 | 1.14 |
| 0 | 0 | 1 | 1 | 1 | 1.54 |
| 0 | 1 | 0 | 0 | 0 | 0.80 |
| 0 | 1 | 0 | 0 | 1 | 1.20 |
| 0 | 1 | 0 | 1 | 0 | 1.30 |
| 0 | 1 | 0 | 1 | 1 | 1.70 |
| 0 | 1 | 1 | 0 | 0 | 1.43 |
| 0 | 1 | 1 | 0 | 1 | 1.83 |
| 0 | 1 | 1 | 1 | 0 | 1.94 |
| 0 | 1 | 1 | 1 | 1 | 2.34 |
| 1 | 0 | 0 | 0 | 0 | 3.18 |
| 1 | 0 | 0 | 0 | 1 | 3.58 |
| 1 | 0 | 0 | 1 | 0 | 3.68 |
| 1 | 0 | 0 | 1 | 1 | 4.08 |
| 1 | 0 | 1 | 0 | 0 | 3.81 |
| 1 | 0 | 1 | 0 | 1 | 4.21 |
| 1 | 0 | 1 | 1 | 0 | 4.31 |
| 1 | 0 | 1 | 1 | 1 | 4.71 |
| 1 | 1 | 0 | 0 | 0 | 4.98 |
| 1 | 1 | 0 | 0 | 1 | 4.38 |
| 1 | 1 | 0 | 1 | 0 | 4.48 |
| 1 | 1 | 0 | 1 | 1 | 4.88 |
| 1 | 1 | 1 | 0 | 0 | 4.61 |
| 1 | 1 | 1 | 0 | 1 | 5.01 |
| 1 | 1 | 1 | 1 | 0 | 5.11 |
| 1 | 1 | 1 | 1 | 1 | 5.51 | wherein a 1 corresponds to a voltage being applied to the switching terminal D4-D0 of the associated switching transistor, thus activating the switching device and connecting its associated resistor between terminals 616 and 672.

Figure 7:
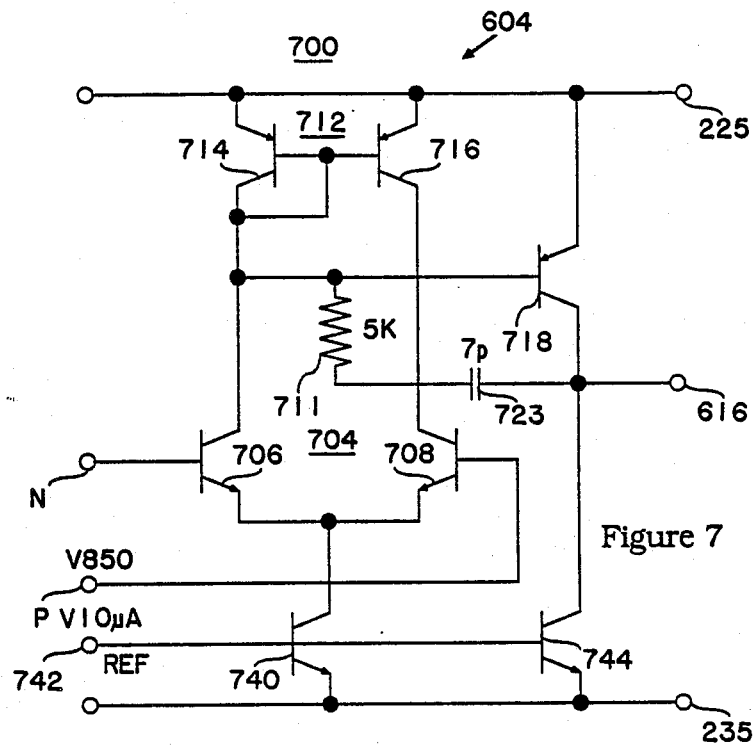
FIG. 7 is a schematic diagram of the first section of the bandpass filter section of the circuit of FIG. 6A.

Referring now to FIG. 7, circuit 700 is the detailed implementation of differential stage 604. The circuit 700 includes a differential pair of transistors 704 comprising transistors 706 and 708 which are disposed with their emitters coupled together. The base of transistor 706 comprises the inverting input of differential stage 604 and is coupled to terminal N of differential stage 604. The base of transistor 708 comprises the non-inverting input of differential stage 604 and is coupled to terminal P of differential stage 604. The differential pair 704 is coupled to current mirror load 712 comprising transistors 714 and 716. The bases of transistors 714 and 716 are coupled together and their emitters are coupled to power supply terminal 225. The base and collector of transistor 714 are coupled together, thus forming the reference transistor for current mirror pair 712.

The output stage of differential stage 604 comprises transistor 718 which is disposed with its base coupled to the common collector connection of transistors 714 and 706 and its emitter coupled to power supply input terminal 225. Frequency response of differential stage 604 is controlled by resistor 711 and capacitor 723 which are coupled in series between the base and collector of transistor 718. In the preferred embodiment of the present invention, resistor 711 is approximately 5 KΩ and capacitor 723 is approximately 7 pF. The collector of transistor 718 produces the output signal of differential stage 604 and is coupled to output terminal 616.

The quiescent current of differential stage 604 is controlled by current sink transistor 740 which is disposed with its emitter coupled to ground terminal 235, its collector coupled to the common emitter connection of differential pair 704 and its base coupled to current source reference terminal V10 μA through terminal 742. Transistor 744 is disposed with its emitter coupled to ground terminal 235, its collector coupled to the collector of transistor 718 and output terminal 616 and its base coupled to current source reference terminal V10 μA through terminal 742. This configuration of an operational amplifier is well known and its operation will be readily understood by a person of ordinary skill in the art.

Figure 8:
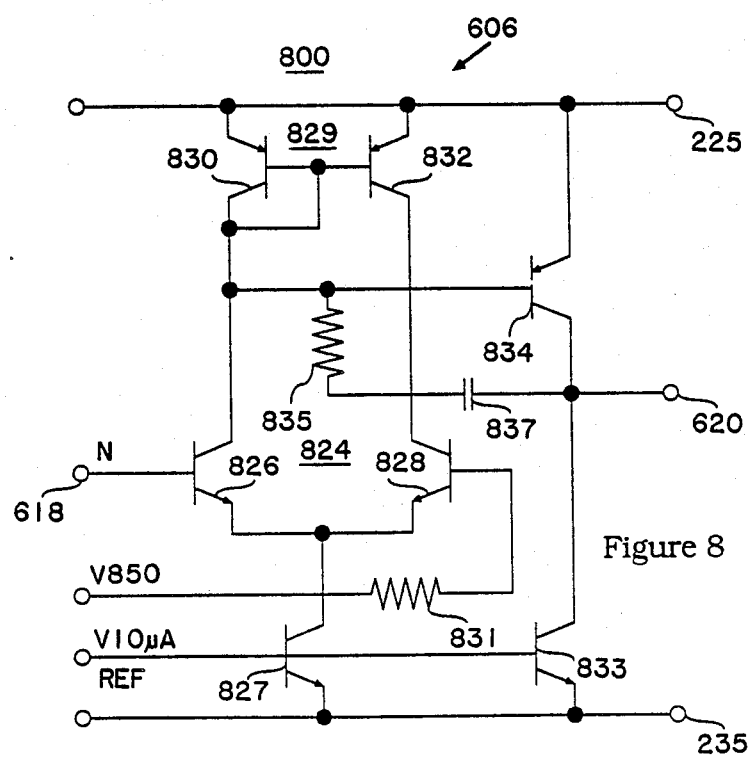
FIG. 8 is a schematic diagram of the second section of the bandpass filter section of the circuit of FIG. 6A.

Referring now to FIG. 8, circuit 800 is the detailed implementation of differential stage 606. The circuit 800 includes differential pair of transistors 824 comprising transistors 826 and 828 which are disposed with their emitters coupled together. The base of transistor 826 comprises the inverting input of differential stage 824 and is coupled to terminal N or 618 of differential stage 606. The base of transistor 828 comprises the non-inverting input of differential stage 606 and is coupled to terminal P of differential stage 606 through resistor 831 wherein terminal P corresponds to terminal V850.

The differential pair 824 is coupled to current mirror load 829 comprising transistors 830 and 832. The bases of transistors 830 and 832 are coupled together and their emitters are coupled to power supply terminal 225. The base and collector of transistor 830 are coupled together, thus forming reference transistor for current mirror pair 829.

The output stage of differential stage 606 comprises transistor 834 which is disposed with its base coupled to the common collector connection of transistors 830 and 826 and its emitter coupled to power supply input terminal 225. Frequency response of differential stage 606 is controlled by resistor 835 and capacitor 837 which are coupled in series between the base and collector of transistor 834. In the preferred embodiment of the present invention, resistor 835 is approximately 3 KΩ and capacitor 837 is approximately 18 pF. The collector of transistor 834 produces the output signal of differential stage 606 and is coupled to output terminal 620.

The quiescent current of differential stage 606 is controlled by current sink transistor 827 which is disposed with its emitter coupled to ground terminal 235, its collector coupled to the the common emitter connection of differential pair 824 and its base coupled to current source reference terminal V10 µA. Transistor 833 is disposed with its emitter coupled to ground terminal 235, its collector coupled to the collector of transistor 834 and output terminal 620 and its base coupled to current source reference terminal V10 µA. Differential amplifiers 604 and 606 are nearly identical with the main difference being the values of the resistor and capacitor which set the frequency response of the differential stage.

Figure 9:
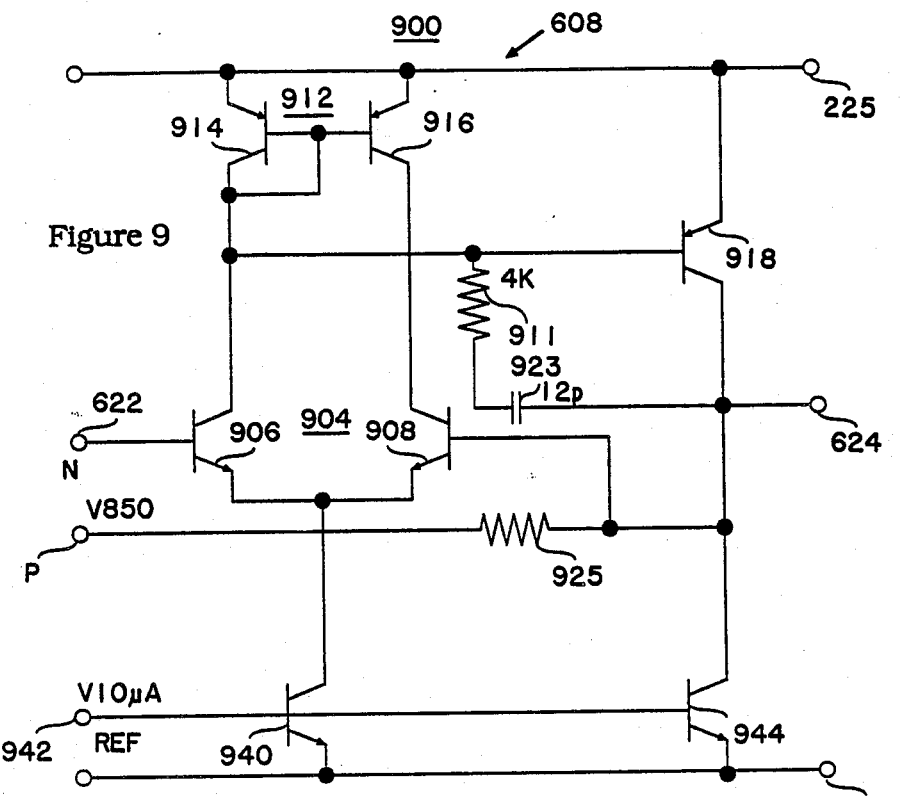
FIG. 9 is a schematic diagram of the third section of the bandpass filter section of the circuit of FIG. 6A.

Referring now to FIG. 9, circuit 900 is the detailed implementation of differential stage 608. The circuit 900 includes a differential pair of transistors 904 comprising transistors 906 and 908 which are disposed with their emitters coupled together. The base of transistor 906 comprises the inverting input of differential stage 608 and is coupled to terminal N or 622 of differential stage 608. The base of transistor 908 comprises the non-inverting input of differential stage 908 and is coupled to terminal P of differential stage 908 through resistor 925 which is further coupled to terminal V850. The differential pair 904 is coupled to current mirror load 912 comprising transistors 914 and 916. The bases of transistors 914 and 916 are coupled together and their emitters are coupled to power supply terminal 225. The base and collector of transistor 914 are coupled together, thus forming the reference transistor for current mirror pair 912.

The output stage of differential stage 608 comprises transistor 918 which is disposed with its base coupled to the common collector connection of transistors 914 and 906 and its emitter coupled to power supply input terminal 225. Frequency response of differential stage 608 is controlled by resistor 911 and capacitor 923 which are coupled in series between the base and collector of transistor 918. In the preferred embodiment of the present invention, resistor 911 is approximately 4 KΩ and capacitor 923 is approximately 12 pF. The collector of transistor 918 produces the output signal of differential stage 904 and is coupled to output terminal 624.

The quiescent current of differential stage 608 is controlled by current sink transistor 940 which is disposed with its emitter coupled to ground terminal 235, its collector coupled to the the common emitter connection of differential pair 904 and its base coupled to current source reference terminal V10 µA through terminal 942. Transistor 944 is disposed with its emitter coupled to ground terminal 235, its collector coupled to the collector of transistor 918 and output terminal 624 and its base coupled to current source reference terminal V10 µA through terminal 942.

Figure 10:
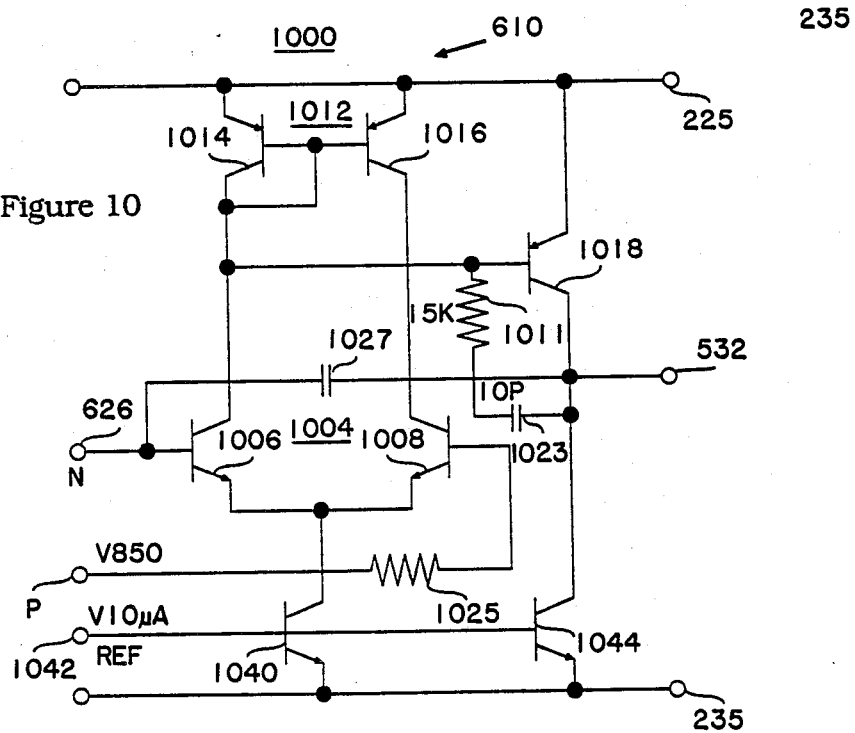
FIG. 10 is a schematic diagram of the fourth section of the bandpass filter section of the circuit of FIG. 6A.

Referring now to FIG. 10, circuit 1000 is the detailed implementation of differential stage 610. The circuit 1000 includes differential pair of transistors 1004 comprising transistors 1006 and 1008 which are disposed with their emitters coupled together. The base of transistor 1006 comprises the inverting input of differential stage 610 and is coupled to terminal N or 626 of differential stage 610. The base of transistor 1008 comprises the non-inverting input of differential stage 610 and is coupled to terminal P of differential stage 610 which is further coupled to V850. The differential pair 1004 is coupled to current mirror load 1012 comprising transistors 1014 and 1016. The bases of transistors 1014 and 1016 are coupled together and their emitters are coupled to power supply terminal 225. The base and collector of transistor 1014 are coupled together, thus forming the reference transistor for current mirror pair 1012.

The output stage of differential stage 610 comprises transistor 1018 which is disposed with it base coupled to the common collector connection of transistors 1014 and 1006 and its emitter coupled to power supply terminal 225. Frequency response of differential stage 610 is controlled, in part, by resistor 1011 and capacitor 1023 which are coupled in series between the base and collector of transistor 1018. Frequency response of differential stage 610 is also controlled by capacitor 1027 which is coupled between input terminal N and output terminal 532. In the preferred embodiment of the present invention, resistor 1011 is approximately 15 KΩ and capacitor 1023 is approximately 10 pF. The collector of transistor 1018 produces the output signal of differential stage 610 and is coupled to output terminal 532.

The quiescent current of differential stage 610 is controlled by current sink transistor 1040 which is disposed with its emitter coupled to ground terminal 235, its collector coupled to the common emitter connection of differential pair 1004 and its base coupled to current source reference terminal V10 µA through terminal 1042. Transistor 1044 is disposed with its emitter coupled to ground terminal 235, its collector coupled to the collector of transistor 1018 and output terminal 1016 and its base coupled to current source reference terminal V10 µA through terminal 1042.

As mentioned above, the present invention contemplates the use of high and low band compressors which process the respective high and low frequency bands. In the preferred practice of the present invention, the high and low band compressors may be of identical topology with the only difference between the two being the signals applied to the respective programming inputs of the respective compressor circuits. Therefore, in the description below, only a single compressor section is described.

Referring now to FIGS. 11A through 11D, there is shown a series of block diagrams detailing several embodiments of compressor or expander sections which may be adapted for use with the present invention. The present invention is readily adaptable to provide either compression or expansion functions in either feedback or feedforward configurations. Compressors and expanders comprise two main components: a variable gain circuit or variolosser and a control circuit which controls the gain of the variable gain circuit based on a desired relationship between the input and output signals. As will be described in more detail below, the variolosser of the present invention is controlled by two current signals, Ia and Ib. Specifically, the gain of the variolosser is set by the ratio Ib/Ia.

Figure 11A:
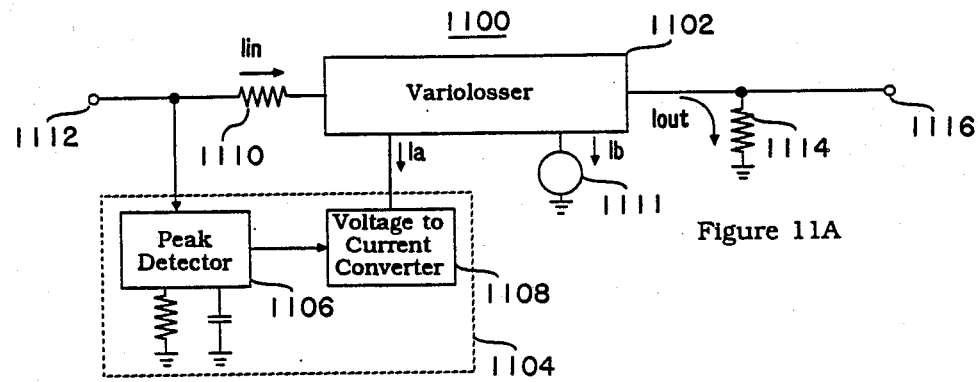
FIGS. 11A-11D are block diagrams of several embodiments of circuits which provide compression or expansion functions.

FIG. 11A is a block diagram of a feedforward compressor 1100. The compressor 1100 includes variolosser 1102 which is coupled to control circuit 1104. The control circuit 1104 includes peak detector 1106 and voltage-to-current converter 1108. The control currents Ia and Ib are used to control the relative currents flowing in differential input and output stages of the variolosser 1102. In the preferred practice of the present invention, both of these currents are controlled during the operation of the compressor. In circuit 1100, control current Ib is shown as a fixed current. Since the gain of the variolosser is controlled by the ratio of Ia to Ib, the desired result may be obtained by controlling Ia while leaving the level of control current Ib constant. In compressor 1100, the voltage-to-current converter 1108 is used to control the magnitude of current flow of control current Ia. The voltage used to control voltage-to-current converter 1108 is derived from peak detector 1106 which is coupled between input terminal 1112 and voltage-to-current converter 1108 so that the magnitude of the current flow level set by voltage-to-current converter 1108 is related to the peak voltage level of the audio input signal. In the preferred practice of the present invention, the variolosser is a variable gain current amplifier with a linear transfer function. Therefore, resistor 1110 disposed at the input of variolosser 1102 converts the voltage appearing at input terminal 1112 to the current signal processed by the variolosser 1102. Similarly, resistor 1114 converts the output current signal produced by the variolosser back to a voltage signal which is generated at output terminal 1116.

The overall operation of compressor 1100 may be explained as follows:

Assume:

Y = voltage envelope of the output signal appearing at terminal 1116;

X = voltage envelope of the input signal appearing at terminal 1112; and

Ib/Ia = gain of variolosser 1100 then:

$Y = (Ib/Ia)X$

If the peak detector detects the positive envelope of the input signal, the result is a constant k times X. If Ia is proportional to this detected voltage:

$Ia = kX$ therefore:

$Y = (Ib/kX)*X = Ib/k$

Thus, Y is independent of the input signal and the circuit functions as a limiter or a compressor.

Figure 11B:
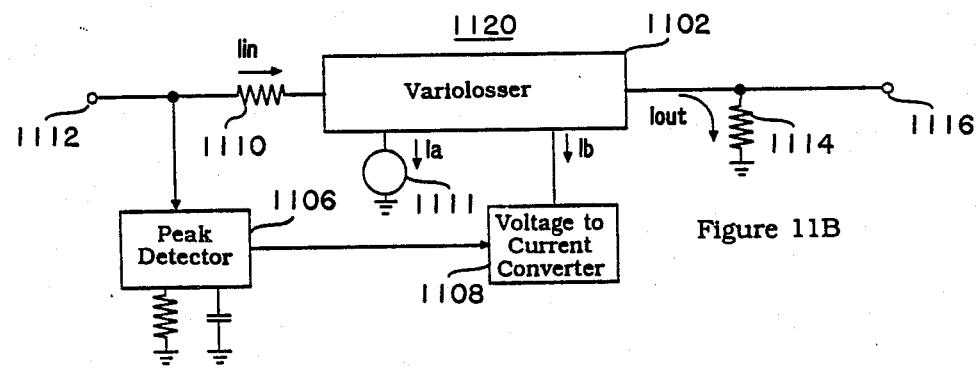

FIG. 11B is a slight modification of the circuit of FIG. 11A wherein the modified circuit 1120 functions as an expander. In this embodiment, control current Ia is maintained at a constant level and control current Ib is controlled by voltage-to-current converter 1108. As above, peak detector 1110 detects the peak envelope of the input signal and generates a signal which sets the magnitude of current flow level in voltage-to-current converter 1108. In this embodiment, since Ib is proportional to the input voltage, an expander is obtained as defined by the following relationships:

Assume:

$Ib = KX$ therefore:

$Y = (Ib/Ia)* X = (KX^2)/Ia$

Hence, this circuit behavior is an expander with an expansion ratio of 2.

Figure 11C:
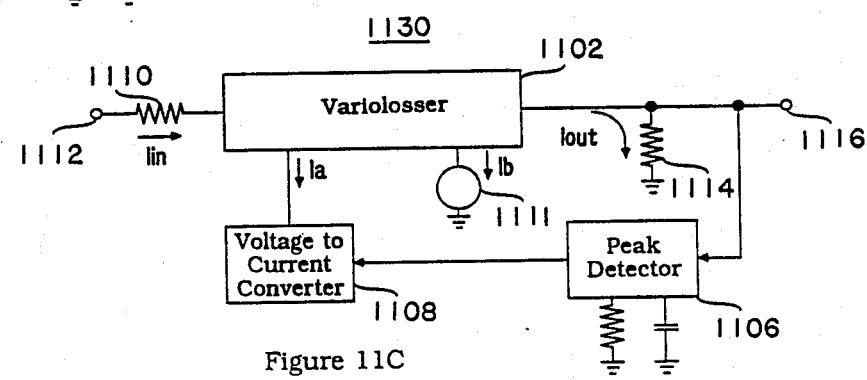

In FIG. 11C, circuit 1130 is configured as feedback compressor. In this embodiment, the peak detector is coupled to the output of circuit 1130 and voltage-to-current converter 1108 is used to control the control current Ia. In this embodiment, since Ia is proportional to the output voltage at terminal 1116, a compressor is obtained as defined by the following relationships:

$Ia = KY$ $Y = Ib*(X/kY)$

Therefore:

$Y = \sqrt{(Ib/k)} * \sqrt{X},$ a compressor with a compression ratio of 2 is obtained.

Figure 11D:
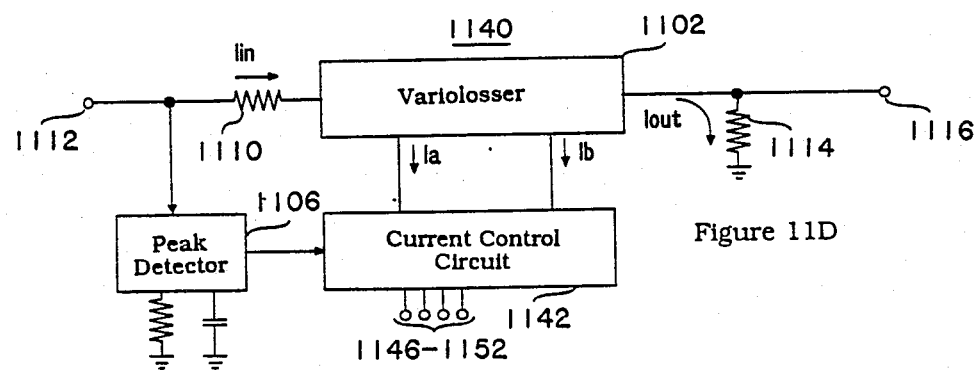

Referring now to FIG. 11D, the preferred practice of the present invention contemplates the use of control circuit 1142 which is adapted to control both control currents Ia and Ib. The control circuit 1142 is responsive to the output of peak detector 1106 and a plurality of programmable control signals coupled to terminals 1146-1152. A more detailed diagram of the preferred embodiment of the compressor control circuit 1142 is shown in FIG. 12.

Figure 12:
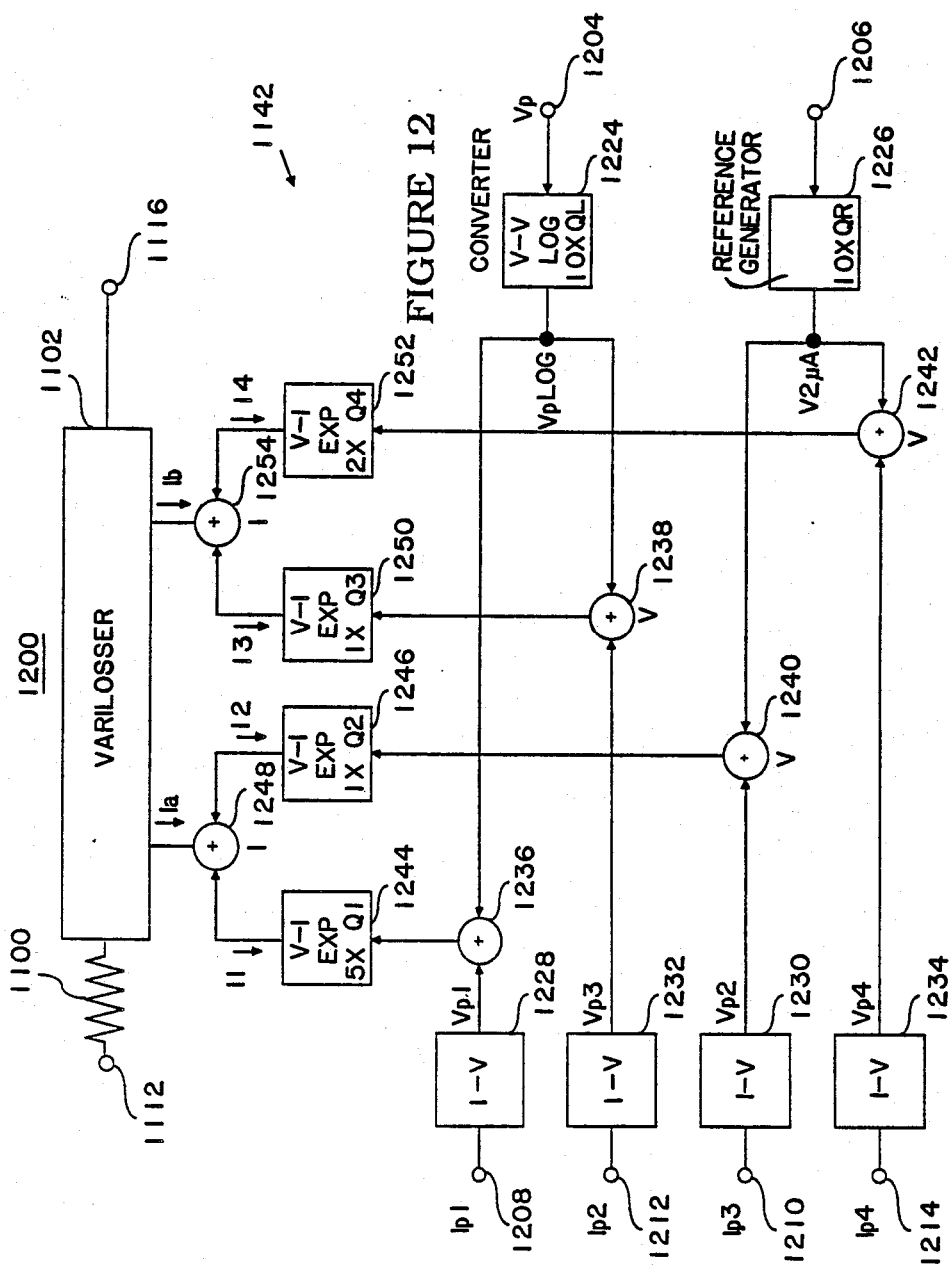
FIG. 12 is a block diagram used to explain the programmable compression ratio feature of the present invention.

Referring now to FIG. 12, there is shown a block diagram detailing the programmable control circuit 1140 of the preferred embodiment of the present compressor circuit. In this aspect of the present invention, a compressor having a programmable continuously variable compression ratio and programmable gain is provided. The circuit 1200 is the detailed circuit implementation of the control circuit 1142. In the circuit 1200, a plurality of programming signals and a plurality of control signals control the variolosser. As above, the gain of variolosser 1102 is set by the ratio of control currents Ia and Ib. Since the response of the human ear is substantially logarithmic, it is desirable to adjust the gain of the compressor in logarithmic steps. The compression transfer function is therefore substantially logarithmic. This is accomplished through the use of a log converter 1224 which processes certain control signals prior to their application to variolosser 1102. The control signals employed in this aspect of the present invention are the output voltage, Vp, of peak detector 1106, which is coupled to terminal 1204, the output voltage, V2 μA, of reference generator 1226, which is coupled to input terminal 1206, and a plurality of selectable programming signals IP1–IP4 which are coupled to input terminals 1208, 1212, 1210 and 1214, respectively. The programming signals coupled to input terminals 1208, 1212, 1210 and 1214 are used to set a desired gain and compression ratio for the system 1200. The signal, Vp, is a linear signal which is logarithmically converted before application to variolosser 1102. Specifically, Vp is coupled to voltage-to-voltage log converter 1224 which converts the linear representation of the peak envelope of the audio input signal to a signal, Vp log, which is logarithmically related thereto.

Each of the programming signals IP1–IP4 is coupled through current-to-voltage converters or resistors 1228–1234 which convert these signals to linearly related voltage signals. The output of log converter 1224 is combined with the outputs of resistor 1228 and 1232 by voltage summers 1236 and 1238, respectively. The output of resistor 1230 is combined with the output of reference generator 1226 by voltage summer 1240. The output of resistor 1234 is summed with the output of reference generator 1226 by voltage summer 1242. The outputs of summers 1236 and 1240 are coupled to exponentiating voltage-to-current converters 1244 and 1246, respectively, which convert the summed voltage signal produced by summers 1236 and 1240 to exponential current signals used to control the variolosser 1102. Specifically, the outputs of exponential voltage-to-current converters 1244 and 1246 are combined by current summer 1248 and the output of current summer 1248 is used to control the variolosser control signal Ia. The outputs of voltage summers 1238 and 1242 are coupled to exponentiating voltage-to-current converters 1250 and 1252. The outputs of exponentiating voltage-to-current converters 1250 and 1252 are combined by current summer 1254 and the output of current summer 1254 is used to control the variolosser control signal Ib.

In operation, the quiescent (minimum) current of compressor 1200 is set by the signal V2 μA output by reference generator 1226. In the preferred practice of the present invention, a transistor with a predetermined emitter area having its emitter coupled to ground and its base coupled to the signal V2 μA will sink approximately 2 μA. Therefore, depending on the required current sinking capacity, the relative sizes of the transistors coupled to V2 μA will vary. In addition, the compressor control signals IP1–IP4 are generated in 0.67 μA increments. These control currents may be incremented in a binary sequence to vary the gain of the structure 1200 over a range of approximately 32 dB. Summers 1236, 1238, 1240 and 1242 combine the various control signals to provide a desired gain and compression ratio. As will be more fully discussed in conjunction with FIGS. 21 and 22, resistors 1228, 1232, 1230 and 1234 are approximately 9 KΩ and therefore these 0.67 μA increments correspond to a 2 dB change in the gain of the variolosser. The present invention relies on the logarithmic characteristics of a transistor conducting in its active region to achieve this aspect of the invention. It is known that the collector current of a transistor increases exponentially with linear increases in its base voltage. Therefore, transistors are employed as the exponentiating voltage-to-current converters 1244–1252 wherein the base voltage of each transistor comprises the input to each respective converter and the collector current of each respective transistor comprises the output of the converter. The present invention advantageously employs this characteristic to provide logarithmic increments in gain with linear increments in the programming currents IP1–IP4.

As mentioned above, control signal V2 μA is used to set the quiescent currents Ia and Ib flowing out of the respective input and output differential cells of variolosser 1102. If all other control and programming signals are absent, Ia is set at 0.2 μA by exponentiating voltage-to-current converter 1246 and Ib is set at 0.4 μA by exponentiating voltage-to-current converter 1252. The current offset in these respective converters is controlled by relative sizes of the transistors which comprise converters 1246 and 1252. In the preferred practice of the present invention, exponentiating voltage-to-current converters 1246 and 1250 are transistors which are the same size, each of them being one-tenth the size of the output transistors of log converter 1224 and reference generator 1226. Exponentiating voltage-to-current converter 1252 is a transistor which is twice as large as transistors 1246 and 1250 and exponentiating voltage-to-current converter 1244 is a transistor which is 5 times as large as converters 1246 and 1250. As will be discussed in more detail below, the present invention relies on the size ratio of various transistors to provide the programmable ratio and gain control functions described herein. There are four transistor emitter area ratios which are important in this context. The ratio of the area of the output transistor of V-V log converter 1224 and the area of the transistor which comprises exponentiating V-I converter 1244, the ratio of the area of the output transistor of V-V log converter 1224 and the area of the transistor which comprises exponentiating V-I converter 1250, the area of the output transistor of reference generator 1226 and the area of the transistor which comprises exponentiating voltage-to-current converter 1246, and the area of the output transistor of reference generator 1226, QR, to the area of the transistor which comprises exponentiating V-I converter 1252. If I1–I4 are defined as the collector currents flowing in the transistors which comprise exponentiating V-I converters 1244, 1246, 1250 and 1252, respectively, the gain of variolosser 1102 then becomes:

$$\text{Gain} = (I3 + I4)/(I1 + I2) = Ib/Ia$$

with the currents I3 and I1 proportional to the voltage Vp and the currents I2 and I4 proportional to the fixed reference V2 μA. The gain of the variolosser may also be expressed in terms of emitter area ratios since the respective emitter area ratios of the above-described transistors control the currents I1–I4. Four parameters, K1–K4, related to the emitter areas of the respective transistors which comprise exponentiating V-I converters 1244, 1246, 1250, and 1252 wherein exponentiating V-I converter 1244=Q1, exponentiating V-I converter 1246=Q2, exponentiating V-I converter 1250=Q3 and exponentiating V-I converter 1252=Q4 may be defined as follows:

$$K1 = \frac{\text{emitter area } Q1}{\text{emitter area } QL} = I1/IL$$

$$K2 = \frac{\text{emitter area } Q2}{\text{emitter area } QR} = I2/IR$$

$$K3 = \frac{\text{emitter area } Q3}{\text{emitter area } QL} = I3/IL$$

$$K4 = \frac{\text{emitter area } Q4}{\text{emitter area } QR} = I4/IL$$

The variolosser gain may then be defined as:

$$\text{Gain} = (K3i + K4/K1i + K2)$$

The compressor gain may therefore be controlled by varying either programming currents or emitter area ratios. In the above expression, the variable i represents programming currents employed herein where the programming currents effectively modify the area ratios of the compressor control circuit.

If no signal is present at terminal 1204, the gain of variolosser 1102 remains constant. However, as Vp increases, Ia increases at a faster rate than Ib because of the size differential of converters 1244 and 1250. Similarly, as the control signals IP1–IP4 are incremented, the gain of the variolosser is varied by controlling the desired ratio of currents Ib/Ia. Incrementing the control signals IP1–IP4 also controls the compression ratio of circuit 1200 by varying Ia relative to Ib, thus providing a wide range of gain and compression ratios. Assuming that control current I3 is zero, at very small signal levels the gain of the variolosser is substantially controlled by the ratio of I4/I2 because current I1 is negligible. As the input signal rises, I1 increases to the point where it equals I2, so that the gain is substantially I4/(I1+I2), or one-half that at low levels. As input signal Vp rises further, the gain approaches I4/I1 and the circuit functions as a soft limiter.

Assuming that control current I3 is not zero, gain at very high levels, where I1 and I3 outweigh I2 and I4, approaches I3/I1. In other words, the drop in gain at high input signal levels is arrested by the presence of I3. The detailed relationship of the various control signals and their effect on gain and compression ratios is discussed further below in conjunction with FIGS. 21 and 22.

Figure 13:
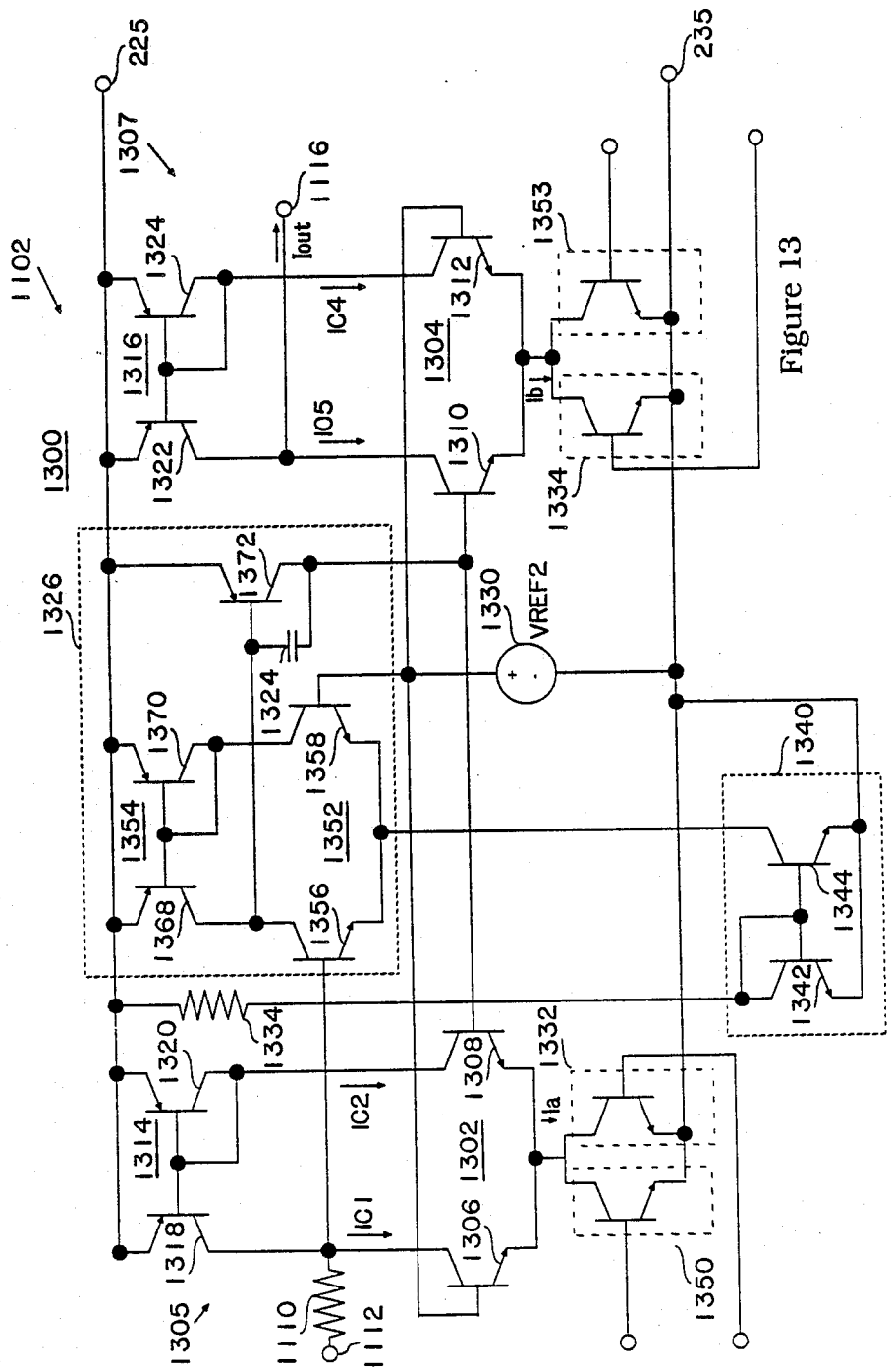
FIG. 13 is a schematic diagram of the variolosser circuit of the present invention.

FIG. 13 is a schematic diagram of variolosser 1102 and it comprises differential cells 1305 and 1307 which include differential pairs 1302 and 1304 disposed with their emitters coupled together. Differential pair 1302 is formed by transistors 1306 and 1308 and differential pair 1304 is formed by transistors 1310 and 1312, respectively. Each of differential pairs 1302 and 1304 is further coupled to current mirror loads 1314 and 1316, respectively. Current mirror 1314 is formed by transistors 1318 and 1320 which are coupled with their bases in common and their emitters coupled to power supply terminal 225. Current mirror 1316 is formed by transistors 1322 and 1324 which are coupled with their bases in common and their emitters coupled to power supply terminal 225. Transistors 1320 and 1324 are each disposed with their bases and collectors in common and, accordingly, they function as diodes.

In circuit 1300, differential cells 1305 and 1307 are coupled in a pairwise configuration. Specifically, the bases of transistors 1308 and 1310 are coupled in common and the bases of transistors 1306 and 1312 are coupled together. Stated alternatively, the inverting input of differential cell 1305 is coupled to the non-inverting input of differential amplifier 1307 and vice versa. Operational amplifier 1326 is disposed with its inverting input coupled to the common collector connection of transistors 1306 and 1318 and its non-inverting input coupled to the common base connection of transistors 1308 and 1310. The common base connection of transistors 1308 and 1310 is further coupled to source of reference potential 1330. The output of operational amplifier 1326 is coupled to the common base connection of transistors 1308 and 1310.

The input signal for the variolosser 1102 is coupled to terminal 1112. Resistor 1110 converts the input voltage to a current signal. One interesting aspect of the present invention lies in the fact that the input current through resistor 1110 is applied to the collectors of transistors 1306 and 1318 in parallel. Positive input currents therefore add directly to the collector current of transistor 1306 (and vice versa). By virtue of the pairwise connections of differential amplifiers 1305 and 1307, equal base/emitter voltages are generated in transistors 1306, 1312 and 1308, 1310, respectively. As a result, the ratio of the collector currents in differential pair 1304 is equal to the ratio of the collector currents in differential pair 1302.

Negative feedback is generated by operational amplifier 1326 and is established through transistors 1306 and 1308, which provide a low impedance summing node for the input current as well as the proper base bias current for transistors 1308 and 1310. Under quiescent conditions, (Iin=0) the differential pairs 1302 and 1304 are balanced with IC1=IC2 and IC4=IC5. As the input current inCreases, an increased current, IC1, is injected into the collector of transistor 1306 and therefore the base/emitter voltage of transistor 1306 increases, while IC2 and the base/emitter voltage of transistor 1308 decreases. Similarly, IC5 and the base/emitter voltage of transistor 1310 increase while IC4 and the base/emitter voltage of transistor 1312 decrease, thus producing an output current at output terminal 1116.

The ratio of the output current to the input current, the current gain, is determined by the ratio of the total amount of current steered out of the common emitter connections of differential amplifiers 1302 and 1304. In other words, the current gain of the variolosser 1102 is determined by the ratio of quiescent currents Ib and Ia which are generated at the respective common emitter connections of differential pairs 1302 and 1304. Therefore, the current gain of variolosser 1300 is determined by the ratio of quiescent collector currents Ia and Ib of transistors 1332 and 1334, which are coupled to the respective common emitter connections of differential pairs 1302 and 1304.

The quiescent collector currents of transistors 1332 and 1334 are controlled by their respective base voltages. If Ia is equal to Ib, the gain of circuit 1300 is unity. If Ia is smaller than Ib, the gain is greater than unity and vice versa. The respective base voltages of transistors 1332 and 1334 may be controlled by voltage sources or by the control circuits of FIG. 12.

The present invention provides a large range of current gain which may be in the range of 80 dB under the control of a small linear DC voltage which may be in the range of −120 mV to +120 mV. The sensitivity of circuit 1300 is therefore in the range of 0.334 dB/mV. This is achieved by using a control voltage to control the base/emitter voltages of current sink transistors 1332 and 1334, thereby taking advantage of the exponential relationship between the collector current and the base-emitter voltage of a transistor in the active region, as discussed above.

Since the input signal of circuit 1300 is applied to a current mirror that is identical to the output current mirror by virtue of the pairwise connection of differential cells 1305 and 1307, current consumption may be held constant regardless of the signal level at input terminal 1112.

In another aspect of the present invention, gain reduction occurs as the magnitude of the input signal increases. As mentioned above, circuit 1300 achieves gain reduction by steering more current into its input stage than its output stage. As a result of this action, and the action of the input current mirror, the variolosser 1102 exhibits maximum signal handling capability for the largest input signals (minimum gain), since the input signal enters the circuit at the point where the largest current is available. Furthermore, since the gain of circuit 1300 is controlled by steering the respective currents in the input and output differential amplifiers, the same circuit may be used as a compressor or expander without any additional circuitry. The circuit 1300 provides a variolosser structure which may be operated successfully at voltages as low as or lower than 1.1 V. As a result of this low voltage operation, circuit 1300 is well suited for hearing aids and other low voltage applications.

Referring again to FIG. 13, the operational amplifier 1326 is formed by differential pair 1352 comprising transistors 1356 and 1358. These transistors are coupled to current mirror load 1354 comprising transistors 1368 and 1370 which are disposed with their bases coupled together and their emitters coupled to power supply terminal 225. The base and collector of transistor 1370 are coupled together, thereby forming the diode portion or current mirror reference transistor for the current mirror pair 1354. A PNP transistor 1572 forms the output stage of operational amplifier 1326 wherein the base of PNP transistor 1372 is coupled to the common collector connection of transistors 1356 and 1368. The emitter of PNP transistor 1372 is coupled to power supply terminal 225 and its collector is coupled to the common base connection of transistors 1308 and 1310. The configuration of operational amplifier 1326 is well known and its operation will be readily understood by a person of ordinary skill in the art.

Reference currents for operational amplifier 1326 are provided by reference current generator 1340 which includes NPN transistors 1342 and 1344 coupled in a current mirror configuration. Transistors 1342 and 1344 are disposed with their bases coupled together and their emitters coupled to ground terminal 235. The collector of transistor of 1344 is coupled to the common emitter connection of transistors 1356 and 1358, thereby providing a current sink for differential pair amplifier 1352. The current sinking capability of reference current generator 1340 is controlled by transistor 1342 disposed with its emitter coupled to ground terminal 235 and its base and collector coupled to power supply terminal 225 through resistor 1334. Since transistor 1342 is clamped to ground, a fixed voltage drop will be developed across resistor 1334 which causes a fixed current to flow through resistor 1334 into transistor 1342, which is mirrored in transistor 1344, thus establishing the quiescent current of operational amplifier 1326.

The low voltage operation aspect of this invention can be appreciated by reference to FIG. 13. The circuit 1300 may be operated at voltages as low as or lower than 1.1 V. As a result of this low voltage operation, it is well suited for applications such as hearing aids. The minimum operating supply voltage for circuit 1300 is determined by the total number of series voltage drops necessary to keep all transistors of circuit 1300 in their proper region of operation. The circuit 1300 has three critical series voltage drops: the base/emitter voltage of transistor 1320, the collector/emitter voltage of transistor 1308 and the collector/emitter voltage of transistor 1332. At low bias currents, transistors in the active region require a base/emitter voltage of 0.65 V and a collector/emitter voltage of 0.15 V. Therefore, circuit 1300 can be reliably operated from power supply voltages as low as 1.1 V. In practice, circuit 1300 has been operated from power supply voltages as low as 0.95 V.

Figure 14:
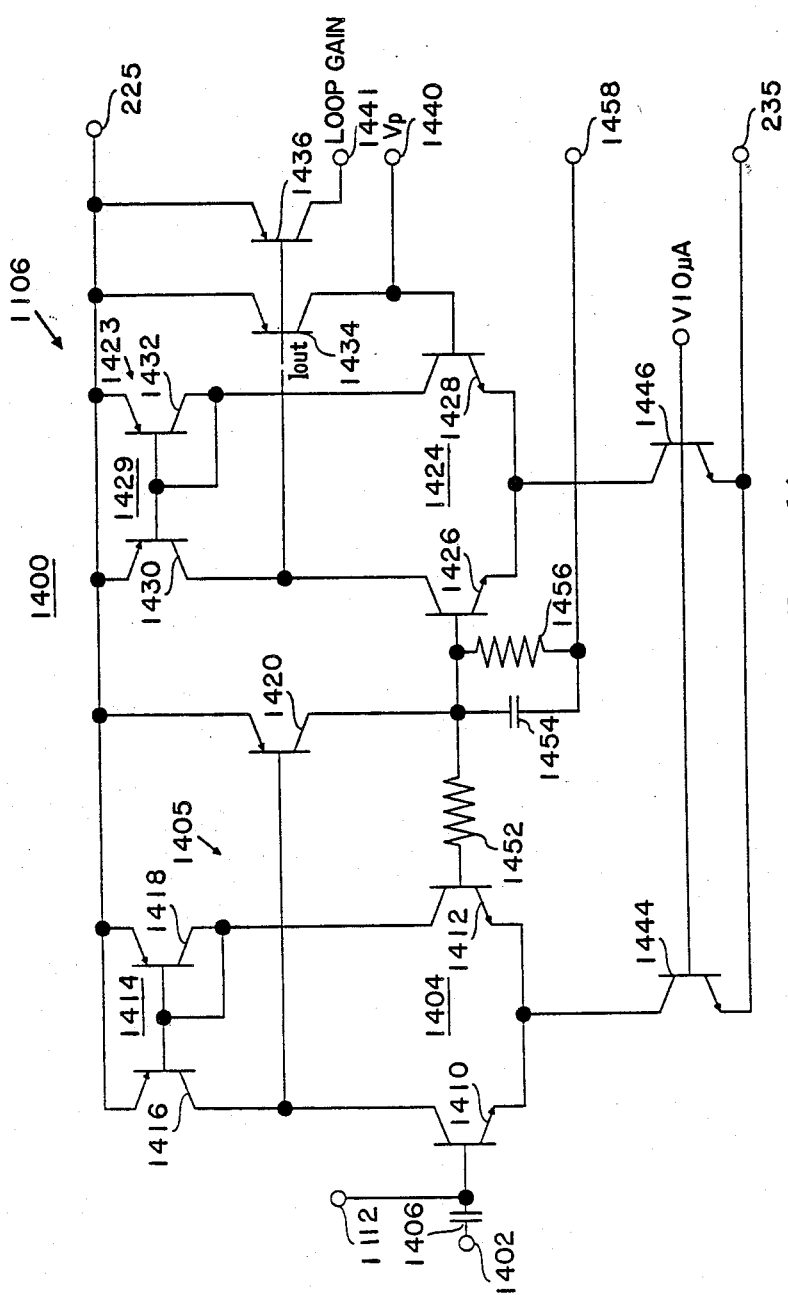
FIG. 14 is a schematic diagram of a peak detector used to detect the envelop of an audio signal to be processed by the compressor of the present invention.

A schematic diagram of a peak detector suitable for use with the present invention is shown in FIG. 14. The peak detector 1106 generates an AC voltage related to the positive peak envelope of the audio input signal. Specifically, the peak detector generates a control signal, Vp, that follows the peak positive envelope of the audio input signal. The circuit 1400 (which is the detailed circuit implementation of the peak detector 1106) is adapted to receive an audio input signal at terminal 1402. The audio input signal is AC coupled to the non-inverting input of differential amplifier 1405 through capacitor 1406. This audio signal is further coupled to variolosser 1102 at terminal 1112. The differential amplifier 1405 includes differential pair 1404 comprising transistors 1410 and 1412 coupled in a common emitter configuration. The base of transistor 1410 comprises the non-inverting input of differential amplifier 1405. The differential pair 1404 is coupled to current mirror load 1414 comprising transistors 1416 and 1418 which are disposed with their bases coupled together and their emitters coupled to power supply terminal 225. Transistor 1418 is coupled with its base and collector coupled together and comprises the reference transistor of current mirror pair 1414. The output stage of differential amplifier 1405 comprises transistor 1420 which is disposed with its base coupled to the collectors of transistors 1416 and 1410 and its emitter coupled to power supply terminal 225.

The output of the circuit of peak detector 1400 comprises a buffer differential amplifier 1423 which includes differential pair 1424 formed by transistors 1426 and 1428 which are disposed in a common emitter confiquration. The differential pair 1424 is coupled to current mirror load 1429 formed by transistors 1430 and 1432 which are disposed with their bases coupled together and their emitters coupled to power supply terminal 225. The base and collector of transistor 1432 are coupled together, thereby forming the reference transistor of current mirror 1429. The output stage of buffer differential amplifier 1423 is formed by transistors 1434 and 1436 which are coupled with their bases coupled to the common collector connection of transistors 1426 and 1430 and their emitter coupled to power supply terminal 225. The output voltage, Vp, of peak detector 1400 is generated at the collector of transistor 1434 which is coupled to the peak detector output terminal 1440. The collector of transistor 1434 is further coupled to the base of transistor 1428 to provide feedback for buffer differential amplifier 1423. The collector of transistor 1436 is coupled to terminal 1441 and produces a loop gain control signal which will be further discussed below.

The emitter currents for differential amplifiers 1405 and 1423 are controlled by transistors 1444 and 1446, respectively, which are disposed with their collectors coupled to the respective common emitter connections of differential pairs 1404 and 1424, their bases coupled together, and their emitters coupled to ground terminal 235. The common base connection of transistors 1444 and 1446 is further coupled to current source voltage reference terminal V10 $\mu$A which establishes a base/emitter voltage for transistors 1444 and 1446, which causes a 10 $\mu$A current to flow through the collectors of these transistors.

The output of differential amplifier 1405 is coupled to the non-inverting input of differential amplifier 1423. The input and output differential amplifiers 1405 and 1423 are coupled together through resistor 1452 which is disposed between the bases of transistors 1412 and 1426. Feedback for differential amplifier 1405 is established by resistor 1452 which is further coupled to the collector of output transistor 1420.

The operation of peak detector 1106 is based on capacitor 1454 and resistor 1456 which are coupled in parallel between the common connection of resistor 1452 and the base of transistor 1426 and bias voltage reference terminal 1458. In operation, capacitor 1454 functions as a storage capacitor which stores a voltage equal to the peak of the input signal, for a time constant set by resistor 1456 modified somewhat by the small base bias current flowing in the base of transistor 1426. Capacitor 1454 stores a voltage which is initially lower than the positive voltage appearing at input terminal 1402. When the voltage stored on capacitor 1454 is lower than the input voltage appearing at terminal 1402, the relatively higher voltage appearing at terminal 1402 forces transistor 1410 into conduction. This in turn forces transistor 1420 further into conduction, thus charging capacitor 1454 rapidly. When the voltage stored on capacitor 1454 exceeds the voltage appearing at terminal 1402, transistor 1410 is forced out of conduction and its associated current mirror transistor is forced into saturation, thus turning off output transistor 1420. In this state, the leakage resistor 1456 discharges capacitor 1454 and reduces the voltage stored thereon to a voltage lower than the input voltage at terminal 1402. The decay rate in this discharging mode is dependent primarily on the values of resistor 1456 and capacitor 1454. The buffer differential amplifier 1423 reduces the discharge rate of capacitor 1454 by providing a high impedance source between capacitor 1454 and output terminal 1440. The signal, Vp, appearing at output terminal 1440 therefore comprises a rectified representation of the input voltage appearing at input terminal 1402 corresponding to the peak positive envelope of the input signal.

Figure 15:
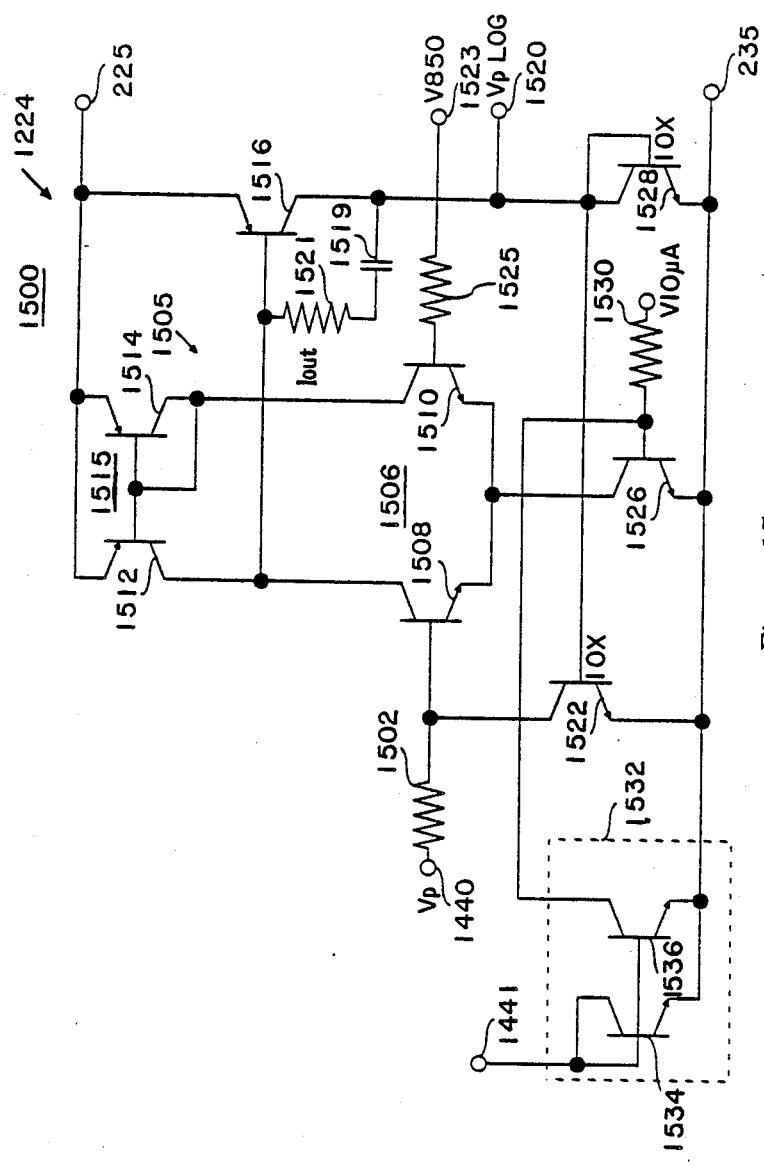
FIG. 15 is a schematic diagram of the voltage-to-voltage log converter described in conjunction with FIG. 12.

Referring now to FIG. 15, there is shown a schematic diagram of the voltage-to-voltage log converter 1224 described in conjunction with FIG. 12. The voltage-to-voltage log converter is used to convert the linear output signal, Vp, of peak detector 1400 to a corresponding logarithmically related voltage level. The input of the circuit 1500 is coupled to peak detector 1400 at terminal 1440. A resistor 1502 is coupled between input terminal 1440 and a summing node input of the input of differential amplifier 1505 which is the base of transistor 1508. Resistor 1502 converts the voltage signal at terminal 1440 to a current signal proportional to the signal Vp processed by voltage-to-voltage log converter 1500. The differential amplifier 1505 includes a differential pair of transistors 1506 comprising transistors 1508 and 1510 which have their emitters coupled in common. The base of transistor 1510 is coupled to a fixed voltage reference V850 at terminal 1523 through resistor 1525. The reference voltage V850 is approximately 850 mV. The differential pair 1506 is coupled to current mirror load 1515 comprising transistors 1512 and 1514. The bases of transistors 1512 and 1514 are coupled together and their emitters are coupled to power supply terminal 225. The base and collector of transistor 1514 are coupled together, thus forming the reference transistor for current mirror pair 1515. The output stage of differential amplifier 1505 comprises transistor 1516 which is disposed with its base coupled to the common collector connection of transistors 1508 and 1512 and its emitter coupled to power supply terminal 225. Frequency compensation for differential amplifier 1505 is provided by resistor 1521 and capacitor 1519 which are coupled in series between the base and collector of transistor 1516. The collector of transistor 1516 produces the output signal, Vp log, of the voltage-to-voltage log converter 1500 and is coupled to output terminal 1520. A transistor 1522 is disposed between the input and the output of voltage-to-voltage log converter 1500 wherein the base of this transistor is coupled to output terminal 1520, its emitter is coupled to ground terminal 235, and its collector is coupled to the common connection of resistor 1502 and the base of transistor 1508.

The logarithmic transfer function of voltage-to-voltage log converter 1224 is generated through the interaction of resistor 1502, differential amplifier 1505 and transistors 1522 and 1528. As an increasing voltage appears at terminal 1440, output transistor 1516 produces an increasing output current. This in turn generates an increasing base/emitter voltage across transistor 1528 which is disposed in a diode configuration. As an increasing base/emitter voltage is generated across transistor 1528, transistor 1522 conducts essentially all of the current flowing through resistor 1502. The voltage at the base of transistor 1522 is therefore logarithmically related to the current flowing through resistor 1502, which in turn is linearly related to the voltage Vp at terminal 1440. The quiescent current of differential amplifier 1505 is controlled by current sink transistor 1526. Transistor 1526 is disposed with its emitter coupled to ground terminal 235, its collector coupled to the common emitter connection of differential pair 1506 and its base coupled to current source reference terminal V10 μA through resistor 1530.

The present invention further includes a means for improving the gain characteristics and stability of the circuit 1500. The circuit 1500 described above may be prone to instability or saturation at high input signal levels. However, it is desirable to set the gain of voltage-to-voltage log converter 1224 relatively high at lower signal levels. The voltage-to-voltage log converter 1224 therefore takes advantage of the loop gain control signal generated by transistor 1436 of circuit 1400. The loop gain control signal is coupled to voltage-to-voltage log converter 1224 at terminal 1441. The loop gain control signal is used to control current mirror 1532 which is formed by transistors 1534 and 1536. Transistor 1534 is coupled with its base and collector in common and therefore forms the reference transistor for current mirror 1532. The bases of transistors 1534 and 1536 are coupled together and the emitters of transistors 1534 and 1536 are coupled to ground terminal 235. The collector of current mirror transistor 1536 is coupled to the common connection of resistor 1530 and the base of current sink transistor 1526. The loop gain control signal is a positive-going signal having the same envelope as peak voltage signal, Vp. At very low signal levels, the level of the loop gain control signal will be too low to activate current mirror 1532. However, as the level of the loop gain signal rises, current mirror transistor 1536 will begin to conduct, drawing reference current away from current sink transistor 1526, thus reducing the gain of differential amplifier 1505. Therefore, the gain of the differential amplifier is reduced at high signal levels, resulting in stable operation at all input signal levels.

Figure 16:
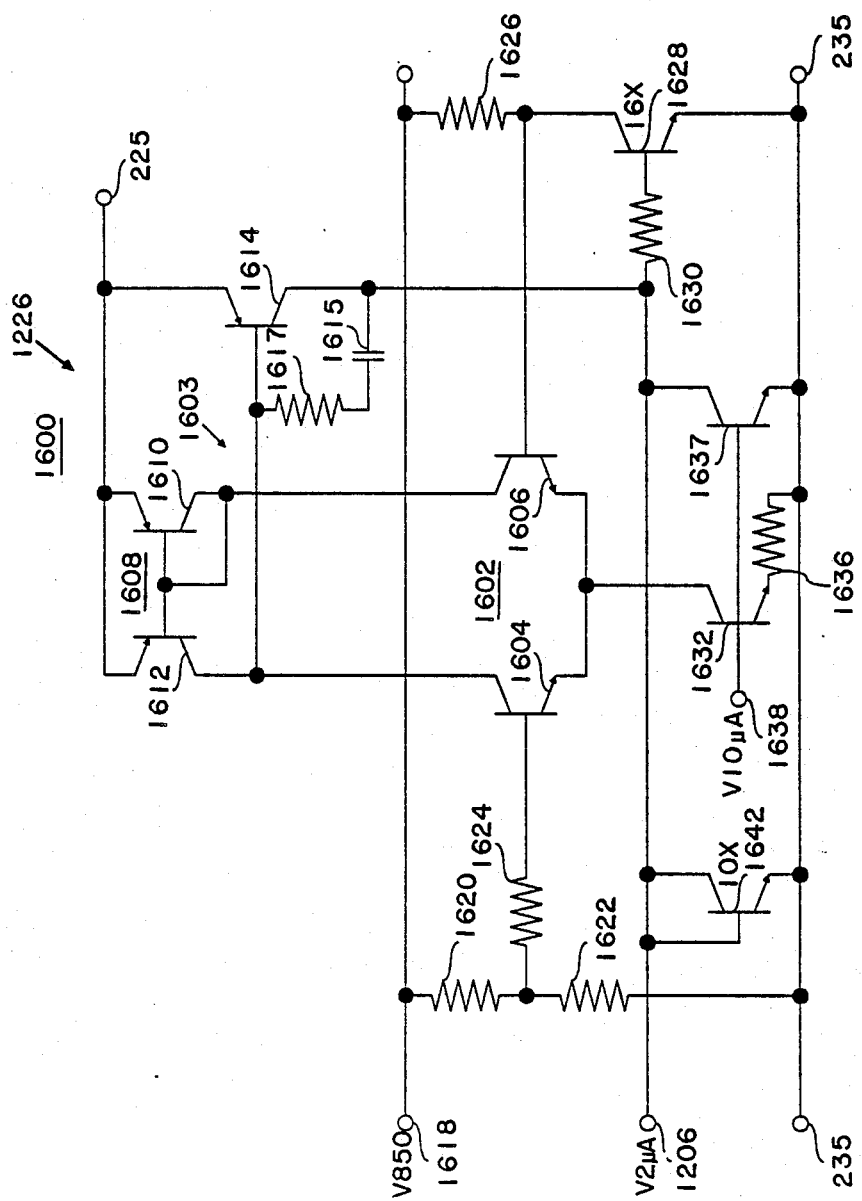
FIG. 16 is a schematic diagram of the reference generator described in conjunction with FIG. 12.

Referring now to FIG. 16, there is shown a schematic diagram of the reference current generator of the present invention. The reference current generator 1226 generates a low impedance, low noise voltage, V2 μA, used for establishing the (low level) gain of compressor 1200. In the preferred practice of the present invention, the reference current generator is a voltage regulator which generates a reference voltage wherein transistors with their bases coupled thereto and their emitters coupled to ground terminal 235 generate a 2 μA reference current. The circuit 1600 includes differential amplifier 1603 which incorporates differential pair 1602 comprising transistors 1604 and 1606 disposed in a common emitter configuration. The base of transistor 1604 comprises the non-inverting input of differential amplifier 1603. The base of transistor 1606 comprises the inverting input of differential amplifier 1603. The differential pair 1602 is coupled to current mirror load 1608 comprising transistors 1610 and 1612 which are coupled with their bases in common and their emitters coupled to power supply terminal 225. The base and collector of transistor 1610 are coupled together and this device forms the reference transistor for current mirror pair 1608. The output stage of differential amplifier 1603 comprises transistor 1614 which is disposed with its base coupled to the common collector connection of transistors 1604 and 1612 and its emitter coupled to power supply terminal 225.

The input signals to differential amplifier 1603 are derived from the regulated voltage source V850 which is coupled to reference generator 1226 at terminal 1618. The V850 voltage source is described in more detail in conjunction with FIGS. 17–19. The non-inverting input of differential amplifier 1603 is coupled to the regulated voltage source input terminal 1618 through a voltage divider formed by resistors 1620 and 1622. The base of transistor 1604 is coupled to the common connection of resistors 1620 and 1622 through resistor 1624. Resistor 1624 increases the impedance at the base of transistor 1604. Resistors 1620 and 1622 are selected so that approximately 50 mV is generated across resistor 1620.

The inverting input of differential amplifier 1603 is coupled to the regulated voltage V850 input terminal 1618 through resistor 1626. Transistor 1628 is disposed with its collector coupled to the common connection of resistor 1626 and the base of transistor 1606. The emitter of transistor 1628 is coupled to ground terminal 235 and the base of transistor 1628 is coupled to the collector of output transistor 1614 through resistor 1630. The quiescent current of differential amplifier 1603 is set by current sink transistor 1632 which is disposed with its emitter coupled to ground terminal 235 through resistor 1636, its collector coupled to the common emitter connection of differential pair 1602, and its base coupled to current source reference voltage V10 μA at terminal 1638.

As mentioned above, the reference voltage appearing at terminal 1618 is regulated at approximately 850 mV. Since the resistive divider formed by resistors 1620 and 1622 is disposed to generate an approximately 50 mV voltage drop across resistor 1620, the feedback provided by transistors 1614 and 1628 will generate the same voltage across resistor 1626, when the circuit is in regulation. Therefore, a 50 mV voltage is generated across resistor 1626. Resistor 1626 is chosen such that approximately 2 μA of current flow into the collector of transistor 1628, thus establishing a base/emitter voltage for transistor 1628 corresponding to this 2 μA current level. The base/emitter voltage of transistor 1628 is used as a reference voltage, designated V2 μA, which is mirrored by transistor 1642, which is disposed with its base and collector coupled to the base of transistor 1628 through resistor 1630 and its emitter coupled to ground terminal 235. The common base and collector connection of transistor 1642 is further coupled to terminal 1206 which comprises the output terminal of reference current generator 1226.

The quiescent current of differential amplifier 1603 is controlled by the current sink transistor 1632 wherein the current sinking capacity of transistor 1632 is controlled by reference voltage V10 μA coupled to terminal 1638. The reference voltage appearing at terminal 1638 sets the current sinking capacity of transistor 1632 at approximately 10 μA, reduced by resistor 1636 to approximately 2 μA.

Differential amplifier 1603 further includes a stabilization means. However, since differential amplifier 1603 processes a fixed voltage input signal, stabilization of differential amplifier 1603 is somewhat simpler than the stabilization technique employed in conjunction with voltage-to-voltage log converter 1500. In reference current generator circuit 1600, stabilization is provided by transistor 1642 which forms a current mirror reference transistor with respect to transistor 1628. Transistors 1642 and 1628 are disposed with relative areas defined by the ratio 10/16. Thus, stability is attained by lowering the gain of differential amplifier 1603 through increased feedback provided by the relative size differential of transistors 1642 and 1628.

The reference voltage V850 used by the reference current generator and other circuits of the present invention is generated by a voltage regulator which is shown in block diagram form in FIG. 17. During the operation of the present invention, the unregulated power supply voltage may vary due to output signal generation by as much as 50 mV and by 200 mV due to battery voltage changes. This may result in undesirable distortion and instability at low battery voltages and high input signal levels. It is therefore desirable to provide power supply isolation to critical circuits to reduce or eliminate this distortion. Many of the circuits of the present invention include, between the power supply input and ground, one base/emitter voltage drop and two collector/emitter drops. As noted above, a typical base/emitter voltage drop for a small integrated circuit transistor operating in the active region is approximately 0.65 V and a typical collector/emitter drop is approximately 0.15 V. The voltage regulator 1700 generates a reference voltage of approximately 0.85 V which is sufficient to provide 0.65 V for the various differential emitter coupled pairs and 0.2 V for the associated current sink transistors.

Referring now to FIG. 17, the V850 voltage regulator is shown in block diagram. The voltage regulator system 1700 includes a pre-regulator 1702 which is coupled to battery 1704. The pre-regulator 1702 reduces battery voltage fluctuations before application to band-gap voltage reference 1706 and output differential amplifier 1708. The regulated output voltage V850 is generated at output terminal 1710. The voltage regulator 1700 further includes a switching means comprised of resistor 1712 and transistor 1714. When a voltage is applied to the base of transistor 1714, resistor 1712 will be coupled through transistor 1714 to ground terminal 235, thus disabling pre-regulator 1702 and voltage regulator 1700. This feature is provided to disable voltage regulator 1700 during those periods when a regulated voltage is not required, thus providing a means of conserving limited battery power. The base terminal 1716 of transistor 1714 may be controlled manually by a switch (not shown) or automatically. All of the circuits of voltage regulator 1700 are referenced to ground terminal 235.

Figure 18:
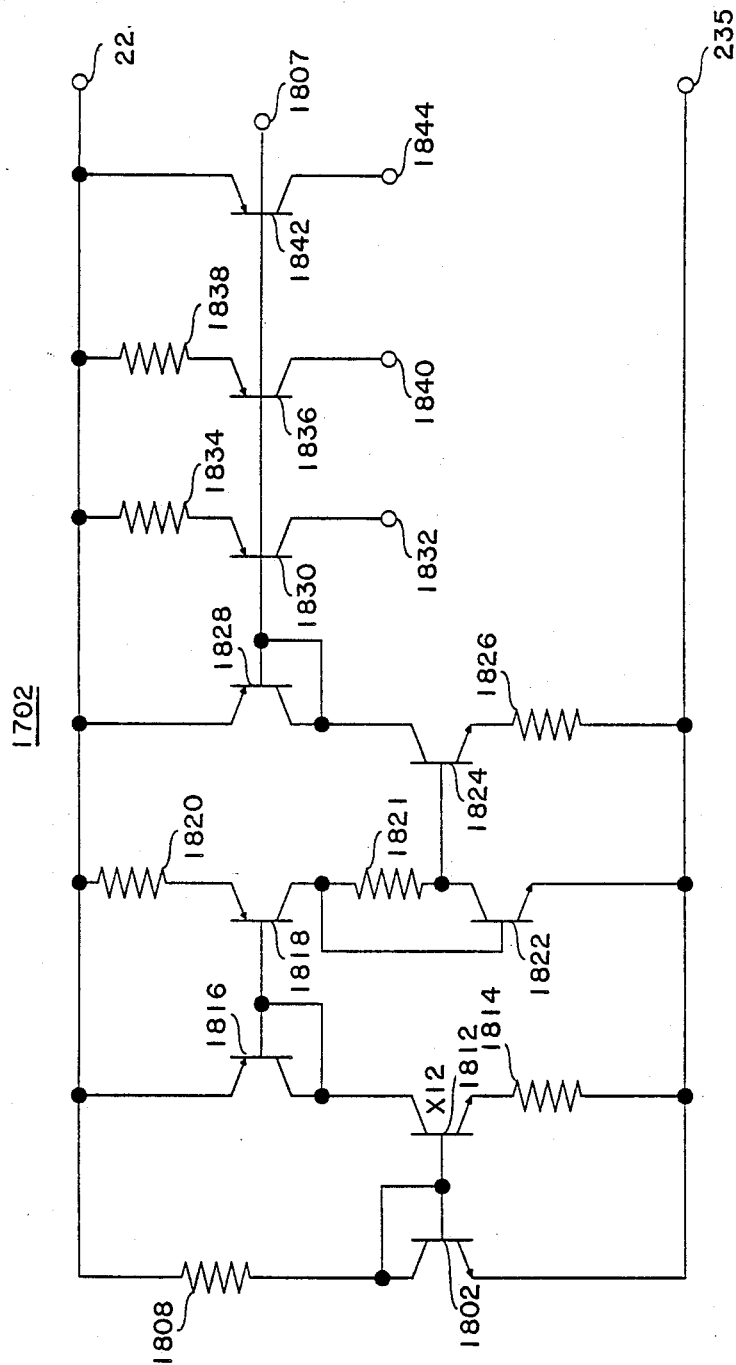
FIG. 18 is a schematic diagram of the preregulator portion of the circuit of FIG. 17.

A detailed schematic of pre-regulator 1702 is shown in FIG. 18. The pre-regulator 1702 includes transistor 1802 which is disposed with its emitter coupled to ground terminal 235 and its base and collector coupled together. The common base and collector connection of transistor 1802 is coupled to power supply terminal 225 through resistor 1808. The voltage generated across transistor 1802 is defined by the following equation:

$$Vce = Vbe = 26 * ln(Vsp - Vbe / R1808 * Is) mV$$

wherein:
Vsp=battery power supply voltage
Is=Saturation current of transistor 1802, typically $10^{-10}$ μA The value of the above logarithm function is approximately 26, and since the sensitivity of ln(x) to x is approximately 1/ln(x), the voltage fluctuations on diode connected transistor 1802 are approximately one twenty-eighths the voltage fluctuations of the voltage which is supplied to power supply terminal 225. The voltage appearing across transistor 1802 is coupled to the base of transistor 1812 which is disposed with its emitter coupled to ground terminal 235 through resistor 1814. Transistor 1812 is a relatively large transistor having an area ratio of 12:1 with respect to transistor 1802. Resistor 1814 is provided to linearize the relationship of collector current to base/emitter voltage in transistor 1812. Without resistor 1814, the ratio of collector current variations would be as large as the ratio of collector current variations flowing through transistor 1802 since these collector currents would be linearly related. The sensitivity of the output current to the input current of transistor 1802 is defined by the following equation:

$$Iout/Iin = 1/(1 + ln\ J1/J2),$$

where J1 is the current density of transistor 1802 and J2 is the current density of transistor 1812.

With equal nominal currents in transistors 1802 and 1812, J1/J2=A2/A1, where A2/A1 represents the relative areas of transistors 1802 and 1812, the combination of transistor 1802, 1812 and resistor 1814 therefore provides a current gain sensitivity of −10.8 dB. Four of these stages are provided in preregulator regulator 1702. The second stage is formed by transistors 1816, 1818 and resistor 1820. Transistor 1816 is disposed with its emitter coupled to power supply terminal 225 and its base and collector coupled together. The common base and collector connection of transistor 1816 is further coupled to the collector of transistor 1812. Transistor 1818 is disposed with its base coupled to the base of transistor 1816 and its emitter coupled to power supply terminal 225 through resistor 1820. As above, the second stage provides a current gain of approximately −10.8 dB and the overall current gain provided at the output of this stage is approximately −22 dB. The output of the second stage, which is the collector of transistor 1818, is coupled to the third stage input transistor 1822 through resistor 1821. Transistors 1822 and 1824 and resistor 1826 form the third stage of pre-regulator 1702. Transistor 1822 is disposed with its emitter coupled to ground terminal 235 and its base coupled to the collector of transistor 1818. Resistor 1821 is disposed between the base and collector of transistor 1822. Transistor 1824 is disposed with its base coupled to the collector of transistor 1822 and its emitter coupled to ground terminal 235 through resistor 1826. Resistor 1821 provides a means of providing zero sensitivity to current variations for pre-regulator 1702. As the current from transistor 1818 increases, the voltage drop across resistor 1821 increases. This in turn lowers the base/emitter voltage of transistor 1824, thus tending to lower its collector current. This is balanced by the rise in base/emitter voltage of transistor 1822. Resistor 1821 is selected so its value is equal to the emitter resistance of transistor 1822. Therefore, when the third stage is in balance, the variation in collector current of transistor 1824 will be approximately zero over a wide range of collector currents of transistor 1822 as well as a wide range of temperature. When in balance, the third stage provides nearly total isolation from current variations. The fourth and final stage of preregulator 1702 is formed by transistors 1828, 1830, 1836 and 1842 and resistors 1834, 1838. Transistor 1828 is disposed with its emitter coupled to power supply terminal 225 and its base and collector coupled together wherein the common base and collector connection of transistor 1828 is coupled to the collector of transistor 1824. Transistors 1828, 1830, 1836 and 1842 are disposed with their bases coupled in common. The emitter of transistor 1830 is coupled to power supply terminal 225 through resistor 134. The emitter of transistor 1836 is coupled to power supply terminal 225 through resistor 1838. The emitter of transistor 1842 is coupled directly to power supply terminal 225. Transistor 1828 functions as a current mirror reference transistor wherein the base/emitter voltage of transistor 1828 causes a related base/emitter voltage to be generated across transistors 1830, 1836 and 1842. Resistors 1834 and 1838 decrease the base/emitter voltage of transistors 1834 and 1836 relative to transistor 1828 and they also provide the same gain linearizing function as resistors 1814, 1820 and 1826. The value of resistors 1834 and 1838 and the area of transistors 1830, 1836 and 1842 are selected to produce a desired current output at terminals 1832, 1840 and 1844, respectively. The regulated current produced at terminal 1832 is used by the band-gap voltage source 1706 and the current produced at terminal 1840 is used by operational amplifier 1708. The collector of transistor 1842 is coupled to the output stage of operational amplifier 1708.

Figure 19:
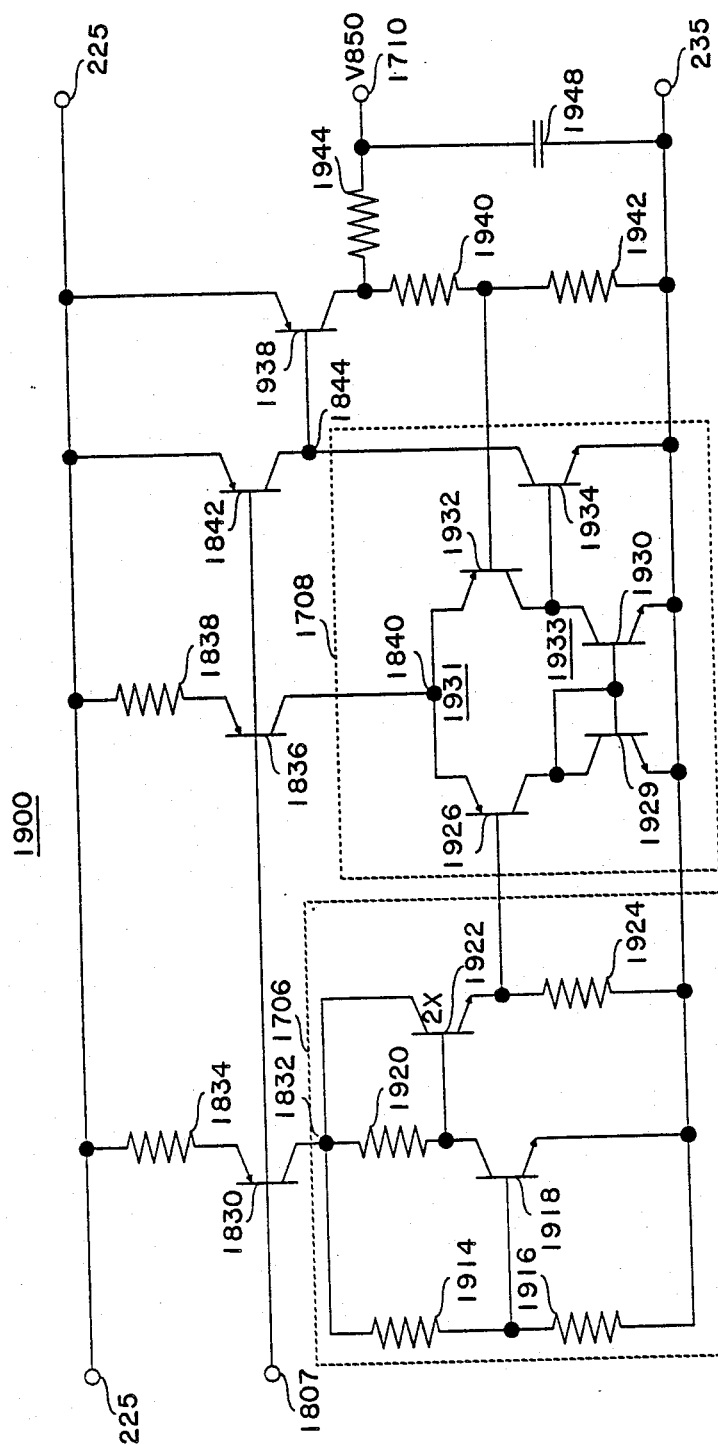
FIG. 19 is a schematic diagram of the preregulator circuit of FIG. 8.

Referring now to FIG. 19, the remainder of regulator 1700 is shown in detail. For the sake of clarity, components which provide identical functions as the circuits of FIGS. 17 and 18 bear identical designations. The circuit 1900 includes band-gap voltage source 1706 and operational amplifier 1708. The band-gap reference 1706 is used to generate a 195 mV reference voltage which is processed by operational amplifier 1708 to produce the 850 mV reference voltage used by various circuits of the present invention. The band-gap voltage reference 1706 is a well known configuration first disclosed by R. J. Widlar, "A new breed of linear ICs runs at 1 volt levels," Electronics, Mar. 29, 1975 p. 115 and it produces a reference voltage which is insensitive to current and temperature fluctuations. The band-gap voltage reference includes resistors 1914 and 1916 which are disposed in series between the current source terminal 1832 and ground terminal 235, thus forming a voltage divider used to bias transistor 1918. Transistor 1918 is disposed with its emitter coupled to ground terminal 235, its base coupled to the common connection of resistors 1914 and 1916 and its collector coupled to current source terminal 1832 through resistor 1920. A transistor 1922 is disposed with its collector coupled to current source terminal 1832, its base coupled to the common connection of resistor 1920 and the collector of transistor 1918 and its emitter coupled to ground terminal 235 through resistor 1924. Transistor 1922 has an emitter area that is twice the area of transistor 1918. The output of band-gap reference 1706 is generated at the emitter of transistor 1922.

In operation, current source transistor 1830 generates a fixed current which is distributed to the various devices of band-gap reference 1706. The output voltage of the band-gap reference can be found by summing the following voltages: the base-to-emitter voltage of transistor 1918, the voltage across resistor 1914, the voltage across resistor 1920, and the emitter-to-base voltage of transistor 1922. The two transistor voltages are opposing and can be written as $$VBE1918\text{-}VBE1922 = (kT/q)*\ln(IC1918/IC1922),$$

a voltage which is proportional to the absolute temperature T (k is Boltzman's constant and q is the electronic charge). The voltage across resistor 1914 is proportional to VBE1918, which has a temperature dependence which is negative and proportional to absolute temperature. By adjusting the value of resistor 1914, the positive and negative temperature coefficients can be made to cancel so that the output voltage is insensitive to temperature. Resistor 1920 makes the circuit insensitive to the value of current flowing from terminal 1832. As this current increases, for example, the voltage across resistor 1914 increases, but most of the current increase is absorbed by transistor 1918, so that the drop across resistor 1920 increases, tending to cancel the rise. The output voltage of the band-gap reference is thereby made insensitive to both temperature and applied current.

The 195 mV voltage produced across resistor 1924 is coupled to one input of operational amplifier 1708. Operational amplifier 1708 includes differential pair 1931 which is formed by transistors 1926 and 1932 having their emitters coupled in common. The common emitter connection of differential pair 1931 is coupled to the collector of current source transistor 1836. The differential pair 1931 is further coupled to current mirror load 1933 formed by transistors 1928 and 1930. Transistor 1928 is disposed with its collector and base coupled together and it forms the reference transistor for current mirror pair 1933. The output stage of differential amplifier 1708 is formed by current source transistor 1842 and transistor 1934 which is disposed with its emitter coupled to ground terminal 235, its base coupled to the common collector connection of transistors 1932 and 1930 and its collector coupled to the collector of current source transistor 1842. The collectors of transistors 1934 and 1842 are further coupled to the base of an output transistor 1938 which is disposed with its emitter coupled to power supply terminal 225. A resistive divider formed by resistors 1940 and 1942 is disposed between the collector of output transistor 1938 and ground terminal 235. The common connection of resistors 1940 and 1942 is further coupled to the base of transistor 1932 to provide feedback for operational amplifier 1708.

During operation, the operational amplifier 1708, through negative feedback, maintains equal voltages at its respective input terminals. Therefore, the 195 mV voltage produced by the band-gap voltage reference 1706 will also be produced across resistor 1942 via the regulator action of operational amplifier 1708. The output voltage of voltage regulator 1900 is controlled by value of resistor 1940 and may be adjusted by trimming the value of this resistor once it is formed on the integrated circuit. The voltage produced at the collector of output transistor 1938 is coupled to output terminal 1710 through resistor 1944. A capacitor 1948 is disposed between output terminal 1710 and ground terminal 235. Resistor 1944 and capacitor 1946 cooperate to reduce high frequency feedback, thus stabilizing the circuit 1900. In the preferred practice of the present invention, circuit 1900 is adjusted to produce an 850 mV output which is used as a voltage reference in several of the circuits described herein.

Figure 20:
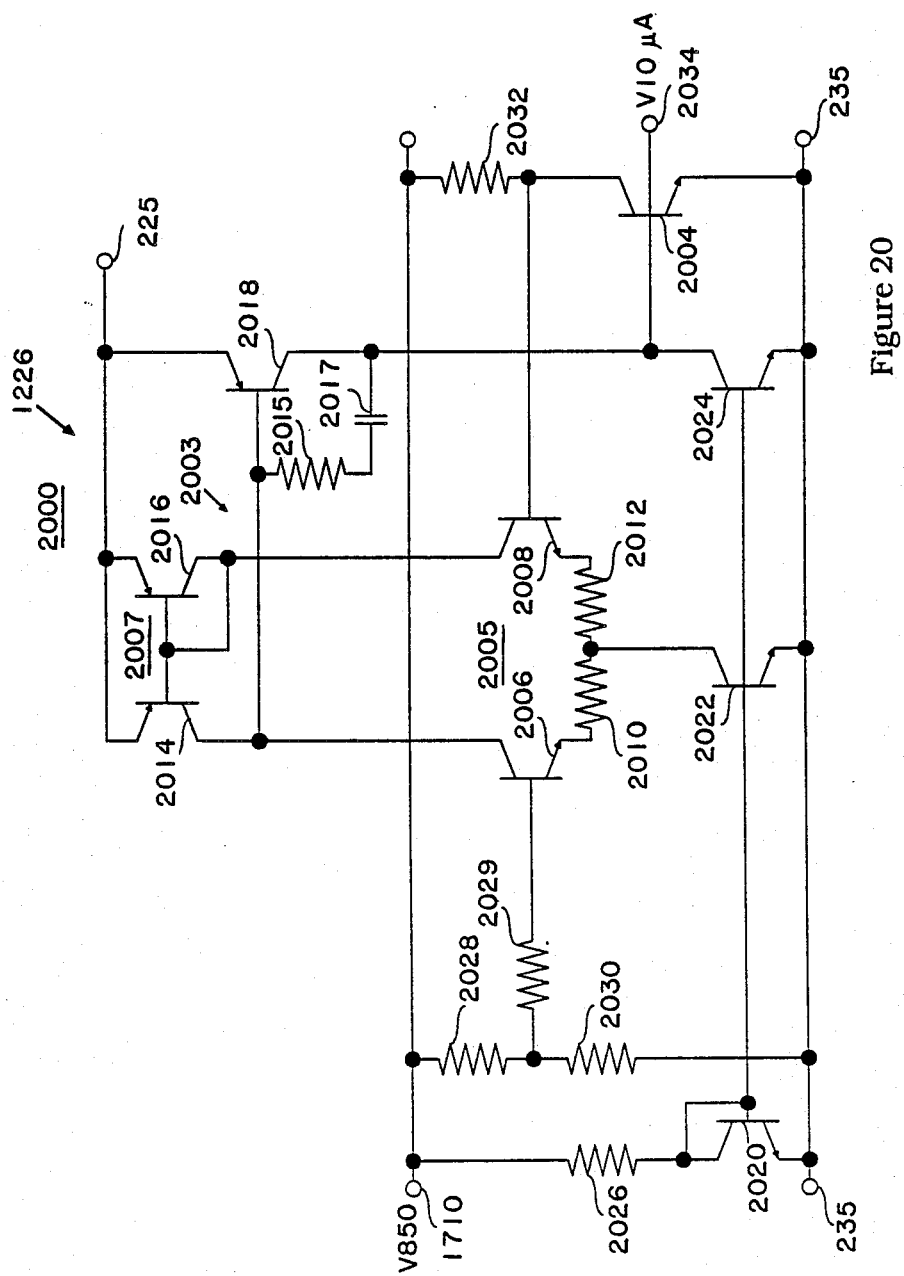
FIG. 20 is a schematic diagram of the bandgap reference and operational amplifier of FIG. 8.

Referring now to FIG. 20, there is shown a schematic diagram of the reference generator used to generate the V10 μA bias voltage mentioned above. Specifically, the V10 μA current source bias reference generator 2000 employs operational amplifier 2003 to control the base/emitter voltage of output transistor 2004. This base/emitter voltage comprises the bias voltage V10 μA used throughout the circuits of the present invention wherein transistors having a predetermined reference emitter area and their bases coupled to the V10 μA bias voltage and their emitters to ground terminal 235 will sink approximately 10 μA of currents. A transistor having an emitter twice the area of the reference emitter area, for example, will sink approximately 20 μA. A reference voltage for the inverting input of operational amplifier 2003 is derived from reference voltage generator 1900 wherein the output of reference voltage generator 1900 is coupled to terminal 1710.

The operational amplifier 2003 includes differential transistor pair 2005 comprising transistors 2006 and 2008. The emitters of differential transistors 2006 and 2008 are coupled together through resistors 2010 and 2012, respectively. The differential pair 2005 is further coupled to current mirror load 2007 comprising transistors 2014 and 2016. The bases of transistors 2014 and 2016 are coupled together and the emitters of current mirror transistors 2014 and 2016 are coupled to power supply terminal 225. Current mirror transistor 2014 is coupled with its base and collector coupled in common and forms the reference transistor for current mirror pair 2007. The output of operational amplifier 2003 is formed by transistor 2018 which is disposed with its collector coupled to the collector of transistor 2024. The collector of transistor 2018 is further coupled to the base of reference transistor 2004. The emitter of transistor 2018 is coupled to power supply terminal 225.

Bias currents for operational amplifier 2003 are provided by transistors 2020, 2022 and 2024 which are disposed with their bases coupled together and their emitters coupled to ground terminal 235. Transistor 2020 is disposed with base and collector coupled together. The common base and collector connection of transistor 2020 is coupled to reference voltage terminal 1710 through bias resistor 2026. Transistor 2020 forms a current mirror reference transistor for transistors 2022 and 2024. The collector of transistor 2022 is coupled to the common connection of resistors 2010 and 2012 and forms the current sink bias transistor for differential pair 2005.

The input signals of operational amplifier 2003 are based on the reference voltage V850 produced by circuit 1900. The non-inverting input of operational amplifier 2003, which is the base of transistor 2006, is coupled to voltage source reference terminal 1710 through resistors 2028 and 2029. The common connection of resistor 2028 and resistor 2029 is further coupled to resistor 2030. The other end of resistor 2030 is coupled to ground terminal 235. Resistors 2028 and 2030 form a resistive divider which provide a divided reference voltage at the noninverting input of operational amplifier 2003. The inverting input of operational amplifier 2003, which is the base of transistor 2008, is coupled to voltage reference terminal 1710 through resistor 2032. The common connection of the base of transistor 2008 and resistor 2032 is further coupled to the collector of voltage reference transistor 2004.

As mentioned above, the base/emitter voltage of voltage reference transistor 2004, which is produced at terminal 2034, is used as a voltage reference wherein transistors having their bases coupled to terminal 2034 and their emitters coupled to ground terminal 235 will sink approximately 10 μA if they are the same area. The resistive divider formed by resistors 2028 and 2030 sets an input voltage at the base of transistor 2006 at approximately 800 mV or 50 mV below the V850 voltage reference. Resistor 2026 establishes the bias current for differential amplifier 2003 by setting the current flow through transistor 2020. This current is mirrored by current sink transistors 2022 and 2024 which bias differential amplifier 2003. When circuit 2000 is in regulation, the feedback provided by transistors 2024 and 2004 will generate approximately 50 mV across resistor 2032. The value of resistor is selected so that 10 μA of current flow through resistor 2032 to the collector of transistor 2004. This current establishes a base/emitter voltage for transistor 2004 corresponding to the 10 μA current level. Thus, any NPN transistor disposed with its base coupled to terminal 2034 and its emitter coupled to ground terminal 235 and an emitter area equal to that of transistor 2004 will sink approximately 10 μA. As additional transistors are coupled to terminal 2034, differential amplifier 2034 will produce sufficient current to maintain the base/emitter voltage at terminal 2034.

Figure 21:
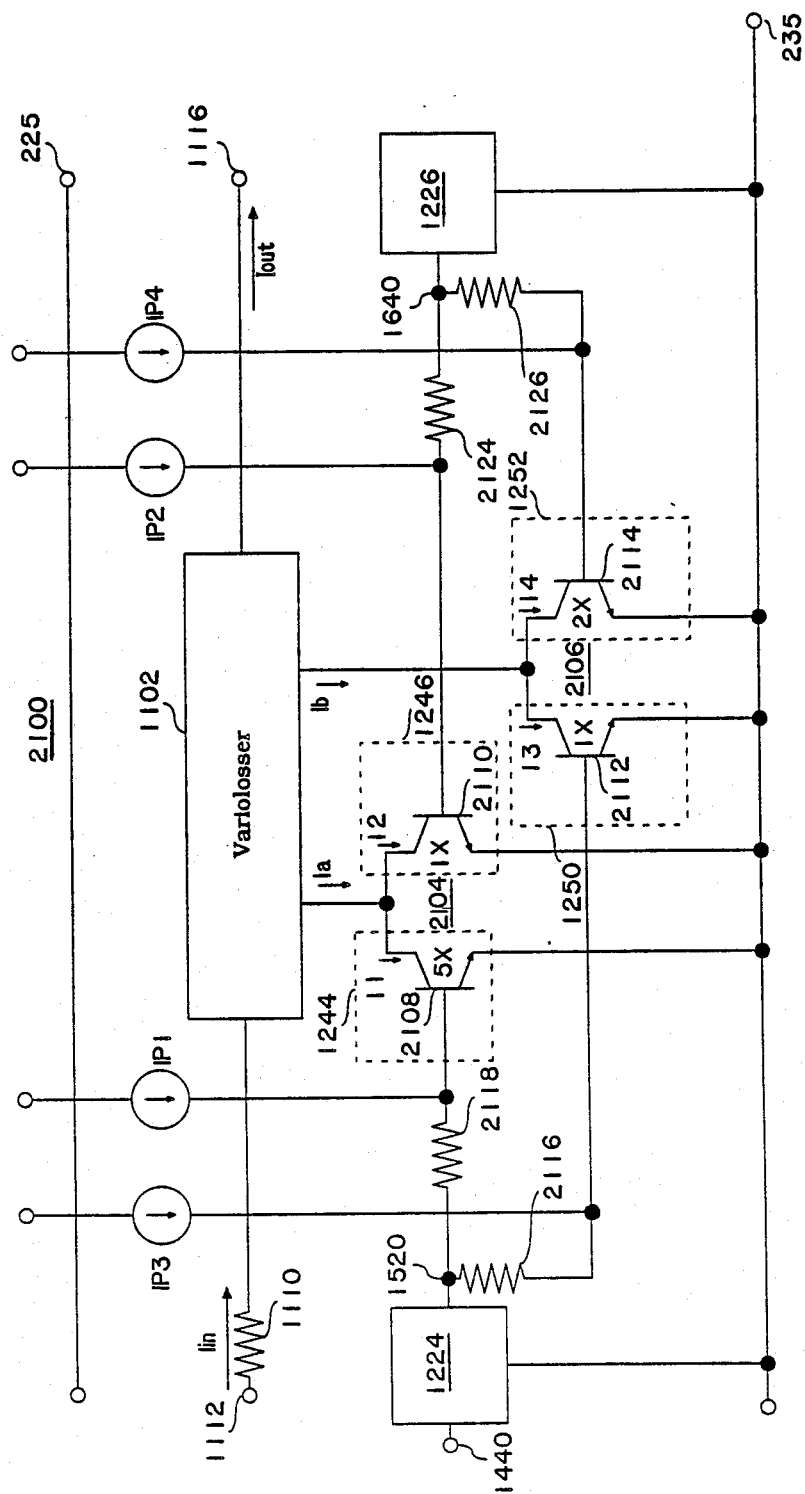
FIG. 21 is a schematic diagram of a current source reference generator used by the various circuits of the present invention.
Figure 22:
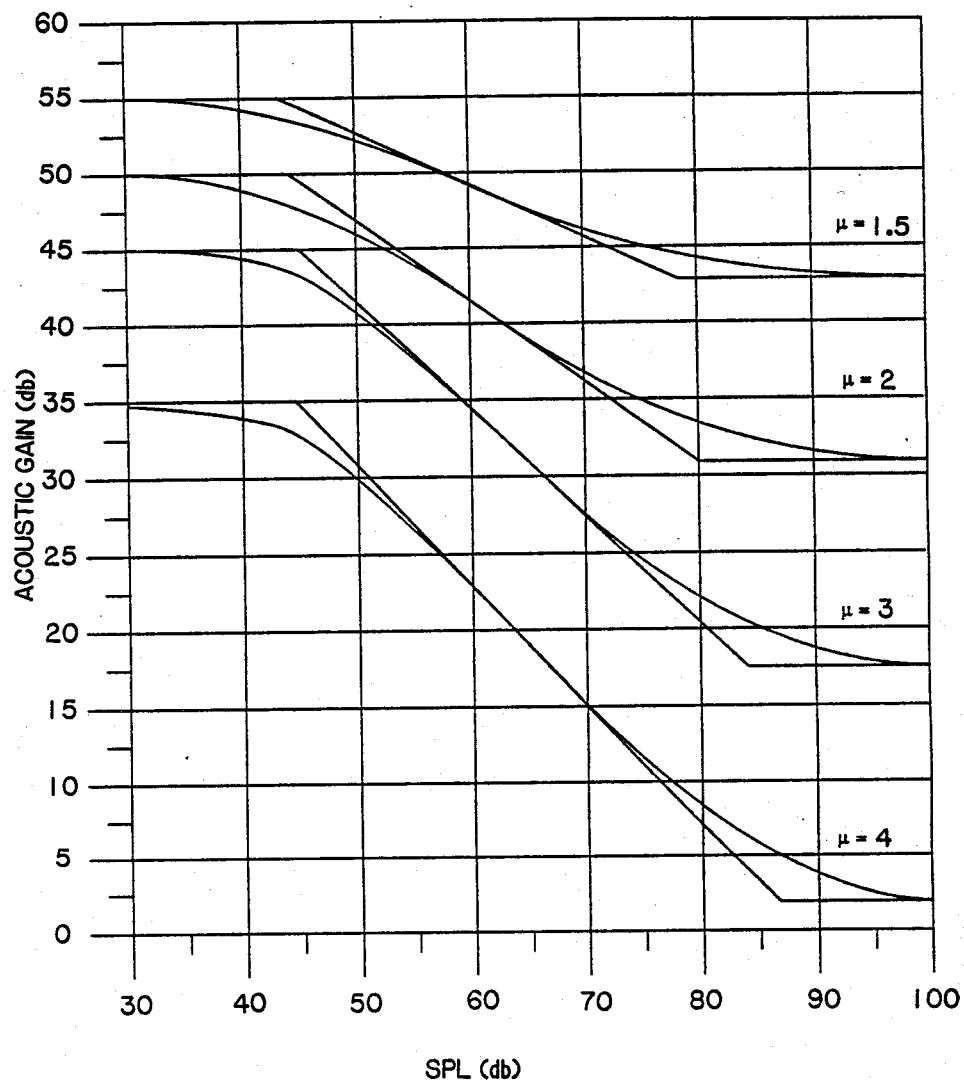
FIG. 22 is a schematic diagram of the preferred embodiment of a circuit for generating the programmed currents for controlling the variolosser of FIGS. 11 or 12, as described in conjunction with FIG. 3.

Referring now to FIG. 21, there is shown a schematic and block diagram of a circuit for controlling variolosser 1102 in accordance with the scheme described in conjunction with FIG. 12. The control circuit 2100 provides a means of combining the compressor control signal, Vp, which is the audio envelope signal generated by peak detector 1106, with the four selectable compressor programming currents IP1–IP4. These programming currents IP1–IP4 may be generated by external circuitry and incremented in steps to provide a range of compression ratios and gain. This feature of the present invention may be advantageously employed to allow the user of the present compressor to vary the gain of the compressor for volume control and to vary the compression ratio for the needs of a particular user. In the preferred practice of the present invention, the four compressor programming currents IP1–IP4 are incremented in 0.67 μA steps to provide 2 dB gain increments over a range of 32 dB. The output programming currents IP3–IP4 are offset by approximately 2 μA with respect to the input control currents IP1–IP2 to allow circuit 2100 to accommodate the above-mentioned volume control feature. The four programming currents may also be individually controlled to achieved a desired compression ratio, thus providing a continuously variable compression ratio. The relationship of acoustic gain versus input signal level for various compression ratios of the circuit 2100 is shown in graph form in FIG. 22.

As mentioned above in conjunction with FIGS. 11A–11D, variolosser 1102 functions as a compressor if the tail current of the input differential pair of variolosser 1102 is increased relative to the tail current in the output differential pair based on a detected peak envelope of the input audio signal. In the preferred embodiment of the present invention, the gain of variolosser 1102 is controlled by the output of reference generator 1226, the programming signal IP1–IP4 and the output of voltage-to-voltage log converter 1224. These signals are used to control current sink transistors 2108, 2110, 2112 and 2114, which correspond to exponentiating voltage-to-current converters 1244, 1246, 1250 and 1252.

The circuit 2100 includes transistor pairs 2104 and 2106. Transistor pair 2104 comprises transistors 2108 and 2110 which are disposed with their collectors coupled together and their emitters coupled to ground terminal 235. Transistor pair 2106 includes transistors 2112 and 2114 which are disposed with their collectors coupled together and their emitters coupled to ground terminal 235. The common collector connection of transistors 2112 and 2114 correspond to current summer 1254 of FIG. 12. The collector current of transistor pairs 2104 and 2106 control the variolosser tail currents Ia and Ib, respectively. The common collector connections of transistor pairs 2104 and 2106 correspond to respective current summers 1244 and 1254 of FIG. 12. As mentioned above, peak voltage detector 1400 generates a voltage, Vp, which is related to the positive peak envelope of the input audio signal. The signal, Vp, is processed by voltage-to-voltage log converter 1224 which produces the signal, Vp log. This signal is coupled to circuit 2100 at terminal 1520, and is coupled to the bases of transistors 2108 and 2112 through resistors 2116 and 2118. The reference signal generated by reference generator 1226 is coupled to circuit 2100 at terminal 1640, and is coupled to the base of transistor 2110 through resistor 2124 and to the base of transistor 2114 through resistor 2126. Resistors 2118, 2124, 2116 and 2126 correspond to current-to-voltage converters 1208, 1230, 1232 and 1234, respectively.

As noted above, the gain and compression ratio of circuit 2100 is controlled by varying the currents Ia and Ib. If Ia and Ib are increased simultaneously with the ratio remaining the same, the overall gain of circuit 2100 remains constant. If Ia is increased more rapidly than Ib, a desired compression ratio may be obtained. In the preferred embodiment of the present invention, resistors 2116, 2118, 2124 and 2126 are approximately 9KΩ. Increasing the current through these resistors causes a corresponding increase in the base voltages of their corresponding transistors 2108, 2110, 2112 and 2114. Therefore, increasing the current through resistors 2116, 2118, 2124 and 2126 increases the corresponding current Ia or Ib. The voltage appearing at terminal 1640 is approximately 570 mV, which corresponds to a current of 0.2 μA flowing into the base of transistor 2110 and 0.4 μA in 2114. This reference current establishes the minimum levels of control currents Ia and Ib and the minimum gain for circuit 2100.

The present invention relies on the inherent gain characteristic of a transistor operating in the active region to provide logarithmic gain and compressor control. This is due to the fact that a linear increment in transistor base current will cause an exponential increase in collector current of the transistor. Since the hearing response of the human ear perceives logarithmic changes in sound level, it is desirable to alter the gain of the circuit 2100 in logarithmic steps. However, it is far simpler to generate linear increments in control currents IP1-IP4. The resistors 2116, 2118, 2124 and 2126 provide a linear current-to-voltage conversion. In the preferred practice of the present invention, transistors 2110 and 2112 are approximately the same size. Transistor 2108 is approximately five times the emitter area of transistors 2110 and 2112. Transistor 2114 is approximately two times the area of transistors 2110 and 2112.

The voltages across resistors 2116 and 2118 are added to the voltage Vp log and the added voltages are applied to the bases of transistors 2108 and 2110. The voltages across resistors 2124 and 2126 are added to V2μA and the added voltages are applied to the bases of transistors 2110 and 2114. Therefore, controlling the voltage across resistors 2116, 2118, 2124 and 2126 also controls the currents Ia or Ib.

Gain control is achieved by controlling the programming currents and the resulting voltage changes across the associated resistors. While these programming voltages are added directly to the control voltage, linear increases in programming voltages will cause an exponential gain increase in variolosser 1102. In the preferred practice of the present invention, the control currents IP1-IP4 are increased in steps of 0.67 μA which corresponds to a 2 dB increase in gain for the circuit 2100. The control currents IP1-IP4 may be stepped in accordance with a binary sequence to achieve gain control over a very wide range.

The programming currents may be generated by a number of sources such as selectable current mirrors or resistive ladders which may be disposed external to the integrated circuit or may be included on the same substrate as the circuit 2100.

Figure 23:
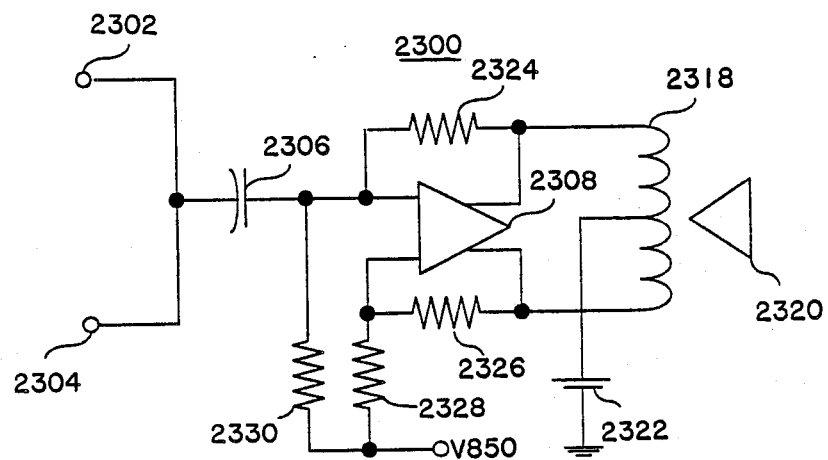
FIG. 23 is a schematic diagram of the class B output stage employed in the practice of the present invention.

Referring now to FIG. 23, there is shown a block diagram of the Class B amplifier described in conjunction with FIG. 1. The Class B amplifier 2300 is capacitively coupled to the high and low band compressors at terminals 2302 and 2304, respectively, through capacitor 2206. The common connection of these terminals comprises the summing means 112. The Class B amplifier of the present invention contemplates the use of the two stage amplifier 2308 wherein various portions of the amplifier conduct during positive and negative cycles of the processed audio signal. Class B operation is desirable because its power supply current drain only rises when loud signals demand it. The respective positive and negative outputs of amplifier 2308 are coupled to an output device comprising the coil 2316 and annunciator 2320. In the preferred practice of the present invention, a power source is suitably coupled to the centertap of coil 2318. The circuit 2300 further includes bias resistors 2324 and 2326 which are coupled between the respective inputs and outputs of amplifier 2308. In addition, bias resistors 2328 and 2330 are coupled between each respective input of amplifier 2308 and the V850 voltage source. The gain and impedance of the circuit 2300 is derived as follows:

Assuming an output voltage of 1000 mV, 500 mV is developed across each output of amplifier 2308. In the preferred practice of the present invention, resistors 2324 and 2326 are 140K ohms and resistors 2330 and 2328 are 5K ohms.

Therefore, the input voltage at both inputs is defined as:

$$500*R2330/R2324 = 500*5/145 = 17.2 \text{ mV}$$

The current through resistor 2324 is then $$(500+17.2)/140 = 3.69 \text{ μA}$$

The current through shunt resistor 2330 is defined as:

$$17.2/5 = 3.45 \text{ μA}$$

The total input currents is then:

$$3.45 + 3.69 = 7.14 \text{ μA}$$

and the transresistance of the stage is 1000/7.14 = 140K ohms.

The input impedance is defined as 17.2 mV/7.14 μ = 2.41K ohms

Since the variolosser 1102 is a current gain device, the 20k ohm input resistor to the compressor works against the 140K ohm transresistance of the Class B stage so that the net voltage gain of the combination is the compressor current gain plus 20 log 140/20, or 16.9 dB plus the current gain of the compressor.

Figure 24:
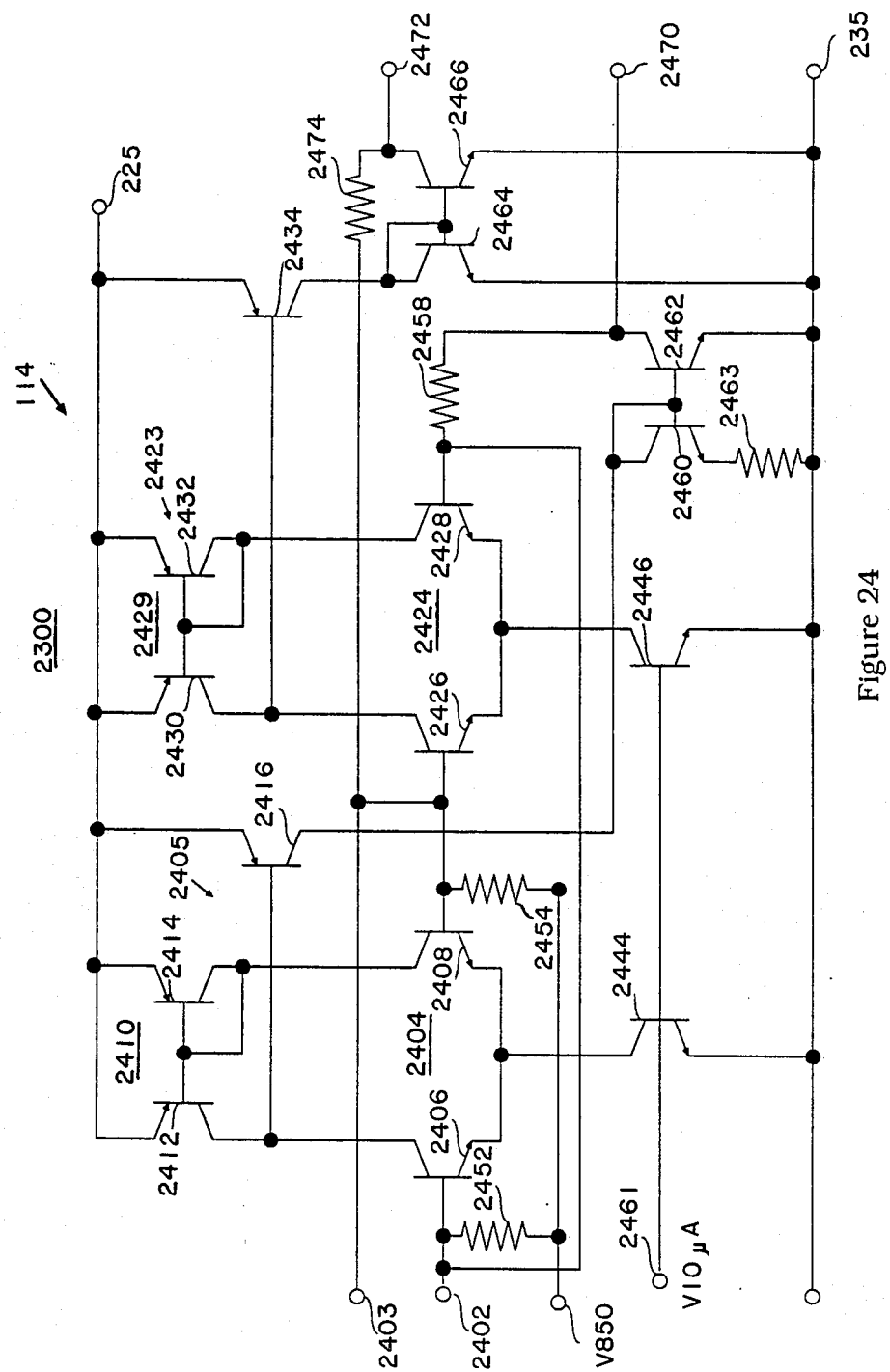
FIG. 24 is a more detailed schematic diagram of the circuit of FIG. 23.

FIG. 24 is a more detailed schematic of the Class B amplifier 2300. The circuit 2300 includes first and second differential pairs 2404 and 2424, respectively, which conduct during positive and negative cycles of the processed audio signal. The differential pair 2404 includes transistors 2406 and 2408 which are disposed with their emitters coupled together. The differential pair 2404 is coupled to a current mirror load 2410 which includes transistors 2712 and 2714. The bases of transistors 2412 and 2414 are coupled together and the base of transistor 2414 is further coupled to its collector. The collector of transistor 2412 is coupled to the collector of transistor 2406 and the collector of transistor 2414 is coupled to the collector of transistor 2408. The output of this stage comprises PNP transistor 2416 which is disposed with its emitter coupled to the power supply input terminal 225 and its base coupled to common collector connection of transistors 2412 and 2406. The emitters of transistors 2412, 2414 and 2416 are coupled to power supply input terminal 225.

The differential pair 2424 includes transistors 2426 and 2428 which are disposed with their emitters coupled together. The differential pair 2424 is coupled to a current mirror load 2429 which includes transistors 2430 and 2432. The bases of transistors 2430 and 2432 are coupled together and the base of transistor 2432 is further coupled to its collector. The collector of transistor 2430 is coupled to the collector of transistor 2426 and the collector of transistor 2432 is coupled to the collector of transistor 2428. The output of this stage comprises PNP transistor 2434 which is disposed with its emitter coupled to the common collector connection of transistors 2430 and 2426. The emitters of transistors 2412, 2414 and 2416 are coupled to power supply input terminal 225.

The bases of transistors 2406 and 2408 are each coupled to the V850 voltage source through resistors 2452 and 2754, respectively. The bases of transistors 2408 and 2426 are coupled together. Current sink transistor 2444 is disposed with its collector coupled to the common emitter connection of transistors 2406 and 2408 and its emitter coupled to ground terminal 235. Current sink transistor 2446 is disposed with its collector coupled to the common emitter connection of transistors 2426 and 2428 and its emitter coupled to ground terminal 235. The bases of transistors 2444 and 2446 are coupled to the V10 μA current reference.

The first input signal to the circuit 2400 is coupled to the base of transistor 2406 at terminal 2402. The second input signal to the circuit 2400 is coupled to the base of transistor 2426 at terminal 2403. The collector of PNP transistor 2416 is used to drive a current mirror formed by transistors 2460 and 2462. Specifically, the collector of transistor 2416 is coupled to the collector of transistor 2460. The base and collector of transistor 2460 are coupled to the base of transistor 2462. The emitter of transistor 2460 is coupled to ground terminal 235 through resistor 2463. The emitter of transistor 2462 is coupled to ground terminal 235. The collector of transistor 2462 comprises the second output of amplifier 2300 and it is coupled to output terminal 2470 and to the base of transistor 2428 through resistor 2458. The collector of PNP transistor 2434 is used to drive a current mirror formed by transistors 2464 and 2466. Specifically, the collector of transistor 2434 is coupled to the collector of transistor 2464. The base and collector of transistor 2464 are coupled to the base of transistor 2466. The emitter of transistor 2464 is coupled to ground terminal 235 through resistor 2465. The emitter of transistor 2466 is coupled to ground terminal 235. The collector of transistor 2466 comprises the first output of amplifier 2300 and it is coupled to output terminal 2472 and to the base of transistors 2426 and 2408 through resistor 2474.

In operation, the two operational amplifiers 2405 and 2423 are essentially symmetrical. Therefore, only the operation of operational amplifier 2405 is described in detail. Operational amplifier 2405 is active only when the base voltage of transistor 2406 is more positive than that of transistor 2408. Under this condition, transistor 2406 conducts so that transistor 2416 also conducts. Collector currents for transistor 2416 flow through diode connected transistor 2460 whose output emitter area is one-fifth that of transistor 2462. The output voltage is developed across have of coil 2318 and this portion of coil 2318 presents a load of approximately 200 Ω. In the emitter coupled pair, transistor 2406 conducts more heavily than transistor 2408, and the current mirror load diode current also drops, reducing the current of transistor 2412, which helps supply the base of transistor 2416. When the base of transistor 2406 becomes more negative than the base of transistor 2408, its collector current drops and that of transistors 2408 and 2414 both rise, tending to raise the current in of transistor 2412. This latter current supplies current formerly supplied by the base of transistor 2416 and this continues until the base current of transistor 2416 drops to zero, at which time the output current of transistor 2416 drops to zero. Any further reduction in the collector current of transistor 2406 will cause transistor 2412 to saturate. This effectively shuts off the output stage.

In most Class B amplifiers, a dead zone is encountered when the amplifier is switching between stages because both amplifier stages turn off simultaneously. In the present invention, this problem is avoided because the amplifiers never turn off simultaneously. Furthermore, non-linearities which may be introduced by the differential pairs 2404 and 2424 are reduced by linearizing resistors 2463 and 2465 which reduce the exponential response of transistors 2460 and 2464.

Accordingly, a programmable multi-band compression system has been described. The present invention includes a method and means of programmably adapting the present invention to compensate for virtually any type of hearing loss by employing a multi-band compression system wherein the gain and frequency response of the system may vary with audio signal level. Accordingly, other uses and modifications will be apparent to a person of ordinary skill in the art without departing from the spirit of the present invention.

What is claimed is:

1. A multi-band compression system comprising means for receiving an audio signal, band split filter means coupled to said receiving means for separating said received audio signal into a plurality of frequency bands, a plurality of compressor means, each of said compressor means being coupled to said band split filter means for compressing a respective one of said frequency bands, summing means coupled to the output of each of said compressor means for combining said respective compressed frequency bands and generating a composite audio signal, means responsive to a first set of control signals for setting the compression ratio of each of said compressor means to a preselected separate value, and means responsive to a second set of control signals for setting the average gain of each of said compressor means to a preselected level independently of the others of said compressor means, wherein said means responsive to said first and second control signals provides frequency response equalization of said composite audio signal.

2. A system according to claim 1 including means responsive to a third set of control signals for setting the respective gains of each of said compressor means to a preselected level to vary the volume of said system.

3. The apparatus of claim 1 further including amplifier means coupled to said summing means for amplifying said composite audio signal.

4. The apparatus of claim 3 further including means for converting said amplified composite audio signal to an audible signal.

5. The apparatus of claim 1 wherein said compression system further includes means for varying the compression ratio of each of said compressor means as a function of input signal level.

6. The apparatus of claim 1 wherein said multi-band compressor system is incorporated in an integrated circuit chip.

7. The apparatus of claim 1 wherein said multi-band compression system is operated from a power source less than or equal to 1.1 volts.

8. A system according to claim 1 including means responsive to a fourth set of control signals for programmably controlling the frequency response of said band-split filter means.

9. A system according to claim 1 wherein said band split filter means is a two stage bandpass filter having low pass and high pass output, said bandpass filter including a plurality of programmable resistors responsive to a fourth set of control signals for programmably controlling the frequency response of said band-split filter means.

10. A system according to claim 1 wherein said receiving means comprises a microphone and a preamplifier.

11. A system according to claim 1 further including control circuit means for generating said first and second set of control signals, and for generating a third and fourth set of control signals.

12. An improved low voltage multiband compression system for implementation on an integrated circuit and adapted for operation at voltages as low as 1 volt comprising:

means for receiving an input signal having maximum and minimum levels and a range of frequencies;

preamplifier means coupled to said receiving means for amplifying said received input signal;

band-split filter means coupled to said preamplifier means for separating said received audio signal into a plurality of frequency bands;

a plurality of low voltage compressor means each coupled to said band-split filter means for compressing said signals in said respective frequency bands, each of said compressor means having means for adjusting the gain and compression ratio of said compressor means; and summing means coupled to the output of each said respective compressor means for combining said respective compressed frequency bands and generating a composite audio signal having a composite frequency response, each of said compressor means having independent means for adjusting the gain of said compressor means to provide a composite frequency response.

13. A method of processing an audio signal comprising:

receiving an audio signal, separating said received audio signal into a plurality of respective frequency bands, compressing each of said respective frequency bands with a compressor to provide compressed respective frequency bands, combining said compressed respective frequency bands and generating a composite audio signal, setting the compression ratio of each of said compressors to a preselected separate value, and setting the average gain of each of said compressors to a preselected level independently of the others of said compressors, wherein frequency response equalization of said composite audio signal is provided by independently setting the average gain of each of said compressors.

14. The method according to claim 13 further including the steps of setting the composite gain of said compressors to a preselected level to vary the volume of said system.

* * * * *